US012593655B2

(12) United States Patent
Choi

(10) Patent No.: US 12,593,655 B2
(45) Date of Patent: Mar. 31, 2026

(54) SYSTEM INCLUDING AN ARRAY OF BONDING HEADS AND AN ARRAY OF DIE TRANSFER SEATS AND A METHOD OF USING THE SAME

(71) Applicant: CANON KABUSHIKI KAISHA, Tokyo (JP)

(72) Inventor: Byung-Jin Choi, Austin, TX (US)

(73) Assignee: CANON KABUSHIKI KAISHA, Tokyo (JP)

( * ) Notice: Subject to any disclaimer, the term of this patent is extended or adjusted under 35 U.S.C. 154(b) by 209 days.

(21) Appl. No.: 18/361,551

(22) Filed: Jul. 28, 2023

(65) Prior Publication Data

US 2025/0038030 A1      Jan. 30, 2025

(51) Int. Cl.
| | |
|---|---|
| *H01L 21/68* | (2006.01) |
| *H01L 21/67* | (2006.01) |
| *H01L 21/683* | (2006.01) |
| *H01L 21/78* | (2006.01) |
| *H01L 23/00* | (2006.01) |

(52) U.S. Cl.
CPC ...... *H01L 21/681* (2013.01); *H01L 21/67144* (2013.01); *H01L 21/6833* (2013.01); *H01L 21/78* (2013.01); *H01L 24/75* (2013.01); *H01L 2224/75821* (2013.01)

(58) Field of Classification Search
CPC ............. H01L 21/681; H01L 21/67144; H01L 21/6833; H01L 21/78; H01L 24/75; H01L 2224/75821
See application file for complete search history.

(56) References Cited

U.S. PATENT DOCUMENTS

| | | |
|---|---|---|
| 6,514,790 B1 | 2/2003 | Plettner |
| 10,096,526 B2 | 10/2018 | Mochizuki |
| 2012/0134065 A1 | 5/2012 | Furuya |
| | (Continued) | |

FOREIGN PATENT DOCUMENTS

| | | |
|---|---|---|
| EP | 3125280 B1 | 12/2020 |
| WO | 2022212260 A1 | 10/2022 |
| | (Continued) | |

OTHER PUBLICATIONS

U.S. Appl. No. 17/935,768, entitled "Apparatus Including a Plurality of Heads and a Method of Using the Same," filed Sep. 27, 2022, pp. 1-45.

*Primary Examiner* — Georgia Y Epps
*Assistant Examiner* — Don J Williams
(74) *Attorney, Agent, or Firm* — Abel Schillinger, LLP

(57)      ABSTRACT

A system can include a substrate chuck, an array of M bonding heads, an array of N*M die transfer seats, and a carriage. The substrate chuck and the array of N*M die transfer seats can be positioned along the carriage. Each of N and M can be greater than 1. A method of using the system can include transferring a first set of dies from the array of N*M die transfer seats to the array of M bonding heads, bonding the first set of dies to a destination substrate, transferring a second set of dies from the array of N*M die transfer seats to the array of M bonding heads, and bonding the second set of dies to the destination substrate. In an implementation, the same carriage including die transfer seats and a substrate chuck can help to reduce movement during an alignment or bonding operation.

20 Claims, 15 Drawing Sheets

(56) References Cited

U.S. PATENT DOCUMENTS

| 2016/0307957 A1* | 10/2016 | A Tharumalingam ....................... |
| | | G01S 7/481 |
| 2018/0366353 A1 | 12/2018 | Chen |
| 2019/0304816 A1 | 10/2019 | Kwag |
| 2023/0245996 A1 | 8/2023 | Sreenivasan |
| 2024/0222351 A1* | 7/2024 | Cherala .................. H01L 24/08 |
| 2024/0404867 A1* | 12/2024 | Choi ....................... H01L 24/75 |

FOREIGN PATENT DOCUMENTS

| WO | 2023056068 A1 | 4/2023 |
| WO | 2023056072 A1 | 4/2023 |

* cited by examiner

SYSTEM INCLUDING AN ARRAY OF BONDING HEADS AND AN ARRAY OF DIE TRANSFER SEATS AND A METHOD OF USING THE SAME

FIELD OF THE DISCLOSURE

The present disclosure relates to systems including arrays of bonding heads and arrays of die transfer seats and methods of using the same.

RELATED ART

Advanced packaging technologies demand high throughput and precise placement of dies. Hybrid bonding can be particularly challenging with small misalignment tolerances. A single-die transfer technique can achieve high precision but has a low throughput. A multi-die transfer technique can achieve the high throughput, but precise placement of dies can be difficult. A need exists for a placement that is high throughput while still meeting specifications for die placement.

SUMMARY

In an aspect, a system can include a first substrate chuck; an array of M bonding heads; an array of N*M die transfer seats; and a carriage. The first substrate chuck and the array of N*M die transfer seats can be positioned along the carriage, and each of N and M is a whole number greater than 1.

In an implementation, N is at most 10.

In another implementation, the system further includes a bridge and a component coupled to the bridge, wherein the array of N*M die transfer seats include bodies and die chucks, and the bridge or the component coupled to the bridge is closer to the die chucks than to the bodies.

In a particular implementation, bonding head chucking surfaces of the array of M bonding heads are oriented to face the first substrate chuck when the carriage is under the array of M bonding heads.

In still another implementation, the system further includes an alignment reference and a plurality of optical components positioned along the carriage, wherein the plurality of optical components are oriented to face the alignment reference when the carriage is in a third position.

In a particular implementation, the array of M bonding heads has an A*B matrix organization, and the plurality of optical components has A optical components, B optical components, or the A*B matrix organization, wherein each of A and B is a whole number.

In a further implementation, the system further includes a second substrate chuck, wherein the second substrate chuck is closer to die chucks of the N*M die transfer seats than to bodies of the N*M die transfer seats when the carriage is over the array of N*M die transfer seats.

In a particular implementation, the array of N*M transfer seats is an array of N*M pick-up heads.

In another implementation, the system further includes a die loading machine configured to load die transfer seats within the N*M array of die transfer seats.

In yet another implementation, the array of M bonding heads has a bonding head pitch, the N*M die transfer seats includes a first set of die transfer seats and a second set of die transfer seats, and die transfer seats of each of the first set of die transfer seats and the second set of die transfer seats are at pitches that are within 2.0% of the bonding head pitch.

In a particular implementation, the second set of die transfer seats are offset from the first set of die transfer seats in a first direction by a first distance that is within 2.0% of 0.5 times the bonding head pitch.

In a more particular implementation, the N*M die transfer seats further includes a third set of die transfer seats and a fourth set of die transfer seats, and die transfer seats of each of the third set of die transfer seats and the fourth set of die transfer seats are at pitches that are within 2.0% of the bonding head pitch.

In a still more particular implementation, the third set of die transfer seats are offset from the first set of die transfer seats in a second direction by a second distance that is within 2.0% of 0.5 times the bonding head pitch, wherein the second direction is perpendicular to the first direction, and the fourth set of die transfer seats are offset from the first set of die transfer seats in the first direction by the first distance in the first direction and in the second direction by the second distance.

In another implementation, the system further includes a base and a bridge spaced apart from the base, wherein the carriage is coupled to the base, and the array of M bonding heads is coupled to the bridge.

In another aspect, a method can include transferring a first set of dies from an array of N*M die transfer seats to an array of M bonding heads, wherein each of N and M is a whole number greater than 1; bonding the first set of dies to a destination substrate; transferring a second set of dies from the array of N*M die transfer seats to the array of M bonding heads; and bonding the second set of dies to the destination substrate.

In an implementation, the method further includes loading die transfer seats within the array of N*M die transfer seats with the first set of dies and the second set of dies, wherein loading the first set of dies and the second set of dies is performed before transferring the first set of dies to the array of M bonding heads and before transferring the second set of dies to the array of M bonding heads.

In a particular implementation, loading the die transfer seats within the array of N*M die transfer seats comprises picking up the first set of dies, the second set of dies, or both the first set of dies and the second set of dies using an array of N*M pick-up heads.

In another particular implementation, loading the die transfer seats is performed using a die loading machine.

In another implementation, the array of M bonding heads has a bonding head pitch, positioning the array of N*M die transfer seats to a first position before transferring the first set of dies, and positioning the array of N*M transfer seats to a second position before transferring the second set of dies, wherein a distance between the first position and the second position is within 2.0% of 0.5 times the bonding head pitch.

In a further implementation, bonding the first set of dies, bonding the second set of dies, or bonding the first set of dies and bonding the second set of dies is part of a hybrid bonding operation.

BRIEF DESCRIPTION OF THE DRAWINGS

Implementations are illustrated by way of example and are not limited to the accompanying figures.

Figure 1:
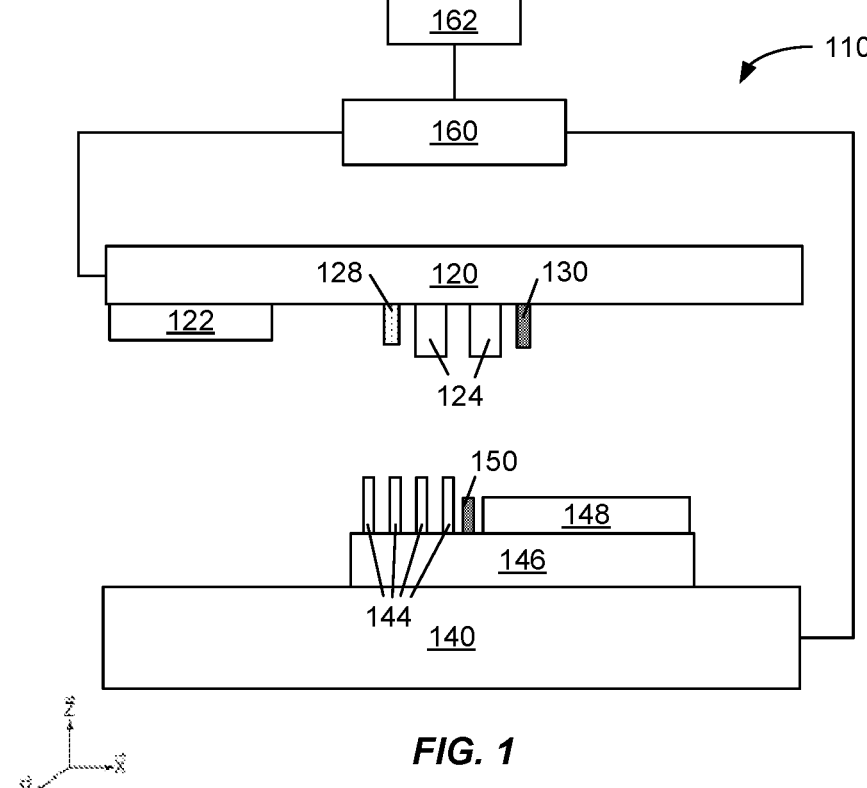
FIG. 1 includes a conceptual view of an apparatus that can be used in transferring dies from a source substrate to a destination substrate.

Skilled artisans appreciate that elements in the figures are illustrated for simplicity and clarity and have not necessarily been drawn to scale. For example, the dimensions of some of the elements in the figures can be exaggerated relative to other elements to help improve understanding of implementations of the invention.

DETAILED DESCRIPTION

The following description in combination with the figures is provided to assist in understanding the teachings disclosed herein. The following discussion will focus on specific implementations of the teachings. This focus is provided to assist in describing the teachings and should not be interpreted as a limitation on the scope or applicability of the teachings.

Unless otherwise defined, all technical and scientific terms used herein have the same meaning as commonly understood by one of ordinary skill in the art to which this invention belongs. The materials, methods, and examples are illustrative only and not intended to be limiting. To the extent not described herein, many details regarding specific materials and processing acts are conventional and can be found in textbooks and other sources within the arts.

A system can include a substrate chuck, an array of M bonding heads, an array of N*M die transfer seats, and a carriage. The substrate chuck and the array of N*M die transfer seats can be positioned along the carriage. Each of N and M can be a whole number greater than 1. A method of using the system can include transferring a first set of dies from the array of N*M die transfer seats to the array of M bonding heads, bonding the first set of dies to a destination substrate, transferring a second set of dies from the array of N*M die transfer seats to the array of M bonding heads, and bonding the second set of dies to the destination substrate. In an implementation, the system can be in the form of an apparatus. In another implementation, the system can further include a die loading machine that is configured to load dies onto the array of die transfer seats.

The system can allow a relatively high throughput of dies for a bonding method and still meet the increasingly stringent dimensional requirements for hybrid bonding. A carriage having a plurality of die transfer seats and a destination substrate chuck can help to reduce vibration or other motion during alignment and bonding as compared to a dual-carriage apparatus having a carriage having the plurality of die transfer seats and another carriage having a destination substrate chuck.

The number of die transfer seats can be selected so that an acceptable throughput is achieved. As the value of N (number of die transfer seats/number of bonding heads) increases, throughput becomes closer to the dual-carriage apparatus. Skilled artisans will be able to determine a value for N that provides a good balance between throughput and cost and mechanical complexity of the apparatus.

The system can be in the form of an apparatus or can include a combination of an apparatus and a die loading machine. The systems and methods of using the systems are better understood with the description below in conjunction with the corresponding figures.

Figure 2:
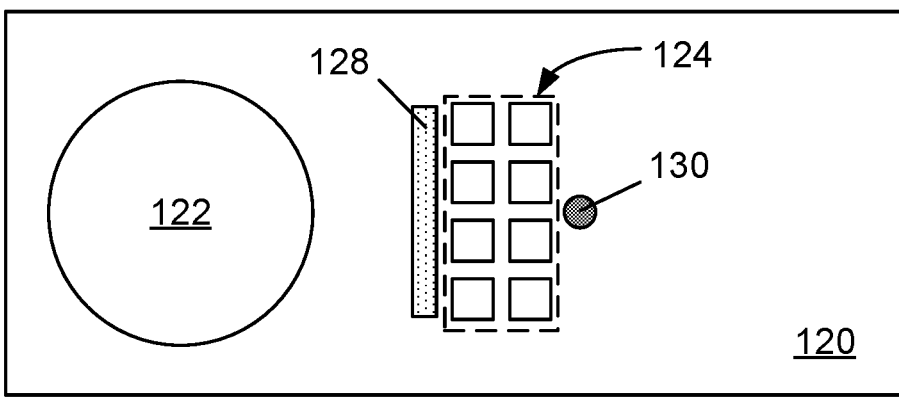
FIG. 2 includes an illustration of a bottom view of a bridge of the apparatus of FIG. 1.
Figure 3:
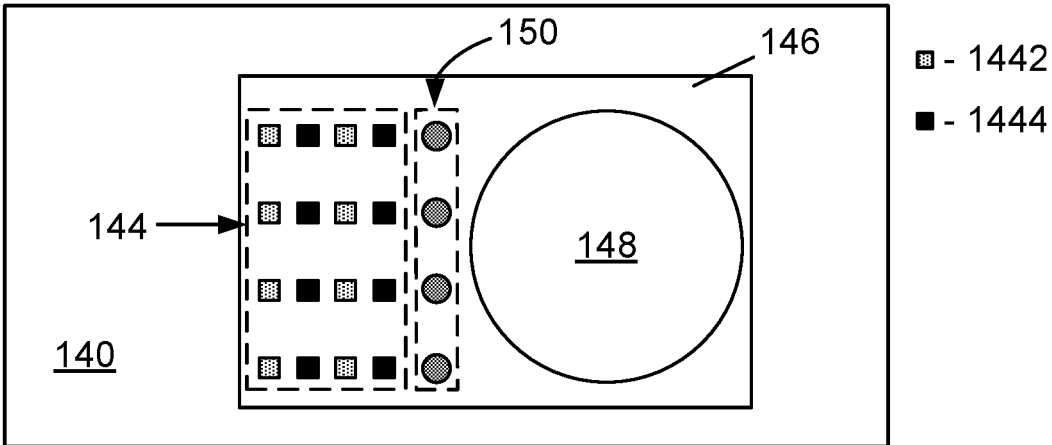
FIG. 3 includes an illustration of a top view of a base of the apparatus of FIG. 1.

FIGS. 1 to 3 include a conceptual diagram of an apparatus 110 and bottom and top views of portions of the apparatus 110. The apparatus 110 can be used to transfer a plurality of dies coupled to a source substrate chuck 122 to a destination substrate coupled to a destination substrate chuck 148. The apparatus 110 includes a bridge 120, a base 140, a controller 160, and a memory 162. The controller can be coupled to the bridge 120, the base 140, or one or more components coupled to the bridge 120 or the base 140. Each of the bridge 120 and the base 140 can be a support structure. The bridge 120 can be coupled to a source substrate chuck 122, an array of bonding heads 124, an alignment reference 128, and an optical component 130. The base 140 can be coupled to a carriage 146.

In FIG. 1, the bridge 120, the base 140, and components physically coupled to the bridge 120 or the base 140 can be organized along an X-direction, a Y-direction, a Z-direction, or a combination thereof. With respect to FIG. 1 and other side views in the figures, the X-direction is between the left-hand and right-hand sides of the figure, the Z-direction is between the top and bottom, and the Y-direction is into and out of the drawing sheet. Unless explicitly stated to the contrary, rotation occurs along a X-Y plane defined by the X-direction and Y-direction.

The source substrate chuck 122 can be a vacuum chuck, pin-type chuck, a groove-type chuck, an electrostatic chuck, an electromagnetic chuck, or the like. The source substrate chuck 122 can be coupled to the bridge 120 by being attached to the bridge directly or can be coupled to the bridge via a carriage (not illustrated). The source substrate chuck 122 has a source holding surface that faces the base 140 or a component coupled to the base 140.

FIG. 2 includes a bottom view of the bridge 120. The array of bonding heads 124 (illustrated within the dashed line) includes M bonding heads and can be configured in an A×B array. The A×B array can be a vector (a row or a column of bonding heads, where A or B is 1) or as a matrix (at least two rows and at least two columns of bonding heads, where each of A and B is at least 2). Regarding the matrix, the number of bonding heads within the array of bonding heads 124 may be different between rows, between columns, or between rows and columns. Some array configurations can be 3×1, 6×1, 2×2, 2×3, 2×4, 4×2, 10×10, or another rectangular shape, where the first number corresponds to the number of bonding heads along a row or column, and the second number corresponds to the number of bonding heads along the other of the row or column. As illustrated in FIG. 2, the array of bonding heads 124 has a 2×4 array of bonding heads, and M is 8. In an implementation, the matrix of bonding heads may take the form of any one of a square lattice, a staggered lattice, a diamond lattice, a rectangular lattice, or a rhombus lattice.

Each of the bonding heads within the array of bonding heads 124 can include a die chuck and a body disposed between the die chuck and the bridge 120. Each of die chucks can be a vacuum chuck, pin-type chuck, a groove-type chuck, an electrostatic chuck, an electromagnetic chuck, or the like. Alternatively, the die chucks can be contactless die chuck, where the die chuck contacts the lateral sides, and not the device side or back side, of the die. The device side is a side of a die where electrical components are formed, the back side of the die is the opposite side of the side, and the lateral sides are disposed between the device and back side of the die. In another implementation, a contactless die chuck can be Bernoulli chuck. When a die includes a thru-substrate via (TSV), the TSV may be exposed along the back side of the die. Contactless chucks can help to reduce the likelihood that an activated surface for bonding contacts the bonding head. In an implementation, the activated surface can include the device side, the back side, or both the device side and back side. The lateral sides may not be activated for bonding.

The bonding heads may be configured such that the die chucks have a limited range of motion relative to their corresponding bodies to provide better positioning when dies are transferred from the array of bonding heads 124 to a destination substrate (not illustrated in FIGS. 1 and 2) coupled to the destination substrate chuck 148. Each bonding head may include a positioning stage which move each bonding head independently in one or more directions of x, y, z, tip, tilt, and rotation. Referring to FIGS. 2 and 3, the bonding heads within the array of bonding heads 124 can have more degrees of movement as compared to the die transfer seats within the array of die transfer seats 144. More details regarding positioning are described with respect to methods of using the apparatus 110. The die transfer seats of the array of die transfer seats 144 may occupy less area of the carriage 146 as compared to the area occupied by the bonding heads within the array of bonding heads 124 with respect to the bridge 120.

Referring to FIGS. 1 and 2, the alignment reference 128 is coupled to the bridge 120. The alignment reference can include marks or other features that can help with proper positioning the carriage 146 with respect to the bridge 120. The alignments reference 128 and optical components 150 (FIGS. 1 and 3) can be used during the alignment operation. More details regarding the optical components 150 are described below with respect to components coupled to the base 140.

The optical component 130 is coupled to the bridge 120 and can be used in determining a pitch of the array of die transfer seats 144. The optical component 130 may also be used to confirm the presence of or identity (for example, a part number or type of die) of a die coupled to a transfer seat within the array of die transfer seats 144 or a destination substrate coupled to the destination substrate chuck 148. If needed or desired, more than one optical component 130 may be coupled to the bridge 120. The optical component 130 may also be used to determine positions of bonding pads on the destination substrate coupled to the destination substrate chuck 148.

Referring to FIGS. 1 and 3, the carriage 146 is coupled to the base 140. The carriage 146 can be a positioning stage and can provide translating motion along the base 140 in the X-direction, Y-direction, or Z-direction or rotational motion about one or more of axes, such as rotation about a Z-axis and along a plane lying along the X-direction and Y-direction.

The array of die transfer seats 144 are coupled to the carriage 146. The array of die transfer seats 144 have bodies and die chucks. The bodies are coupled to the carriage 146. The bridge 120 or a component coupled to the bridge 120 is closer to the die chucks than to the bodies of die transfer seats within the array of die transfer seats. In FIG. 3, the array of die transfer seats 144 are illustrated within a dashed line. In the implementation illustrated in FIG. 3, the array of die transfer seats 144 includes a set of die transfer seats 1442 and an other set of die transfer seats 1444. For simplicity, the set of die transfer seats 1442 is referred to hereinafter as the set 1442, and the other set of die transfer seats 1444 is referred to hereinafter as the set 1444. The significance of the sets 1442 and 1444 and their relationship to the array of bonding heads 124 is addressed in more detail below. In an implementation, the die transfer seat can have a die chuck that can be of any type described with respect to the array of bonding heads 124. The die transfer seats and the bonding heads may be of the same type or different types. In an implementation, the die transfer seats within the array of die transfer seats can be pick-up heads.

The array of die transfer seats 144 can be configured as a vector (a row or a column of pick-up heads), or as a matrix (at least two rows and at least two columns of pick-up heads), or as a staggered array. Regarding the matrix, the number of bonding heads within the array of die transfer seats 144 may be different between rows, between columns, or between rows and columns. Some array configurations can be 3×1, 6×1, 2×2, 2×3, 2×4, 4×2, 10×10, or another rectangular shape, where the first number corresponds to the number of pick-up heads along a row or column, and the second number corresponds to the number of pick-up heads along the other of the row or column. In theory, dies from an entire source wafer may be transferred all at once. For such a configuration, the array of die transfer seats 144 will have fewer pick-up heads along rows closer to the top and bottom of the array as compared to the row or the pair of rows closest to the center of the array, and the array of die transfer seats 144 will have fewer pick-up heads along columns closer to the left-side and right-side of the array as compared to the column or the pair of columns closest to the center of the array. After reading this specification, skilled artisans will be able to determine an array configuration for the array of die transfer seats 144 that meets the needs or desires for a particular application.

The array of die transfer seats 144 can be configured such that it has at least N*M die transfer seats, where M is the number of bonding heads, and N is a multiplier. Each of N and M is greater than 1. In an implementation, each of N and M is at least 2. In the same or different implementation, N is a whole number or is not a whole number, for example as 1.5. In theory, N is not limited; however, in practice, N may be at most 10. As illustrated in FIGS. 2 and 3, the array of bonding heads 124 had 8 bonding heads (M=8), the array of die transfer seats 144 has 16 die transfer seats, and thus, N is 2.

Referring to FIGS. 2 and 3, the array of bonding heads 124 has an A×B array configuration. For the array of die transfer seats 144, each of the sets 1442 and 1444 has an A×B array configuration. In particular, the array of bonding heads 124 and the sets 1442 and 1444 have 2×4 matrix configurations. The array of bonding heads 124 has a bonding head pitch. The die transfer seats within each of the sets 1442 and 1444 can have a bonding head-matching pitch, wherein the bonding head-matching pitch is within 2.0%, 1.0%, or 0.5% of the bonding head pitch. The array of bonding heads 124 has an X-direction bonding head pitch and a Y-direction bonding head pitch, and each of the sets 1442 and 1444 can be positioned to have an X-direction bonding head-matching pitch and a Y-direction bonding head-matching pitch. In the same or different implementation, the X-direction bonding head-matching pitch for each of sets 1442 and 1444 can be within 2.0%, 1.0%, or 0.5% of the X-direction bonding head pitch for the array of bonding heads 124, and the Y-direction bonding head-matching pitch for each of the sets 1442 and 1444 can be within 2.0%, 1.0%, or 0.5% of the Y-direction bonding head pitch for the array of bonding heads 124.

Figure 4:
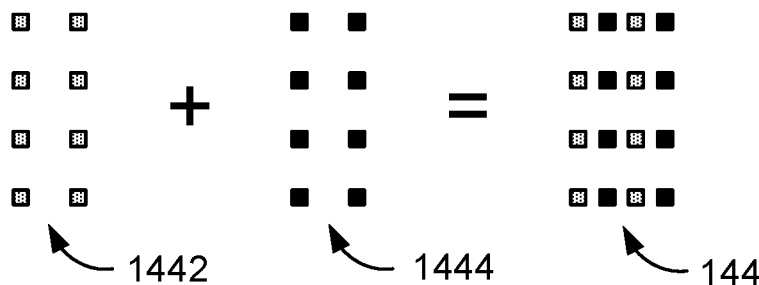
FIG. 4 includes an illustration of an organization of die transfer seats in accordance with an implementation.
Figure 5:
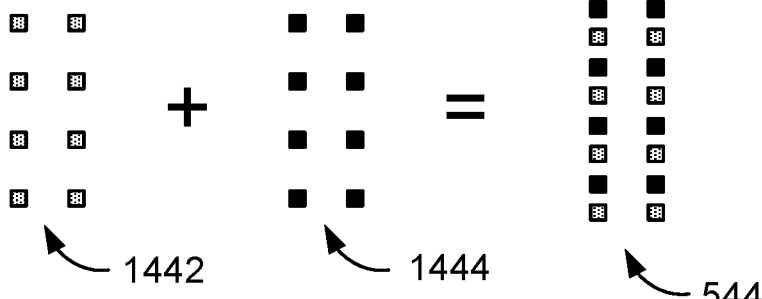
FIG. 5 includes an illustration of an organization of die transfer seats in accordance with another implementation.
Figure 6:
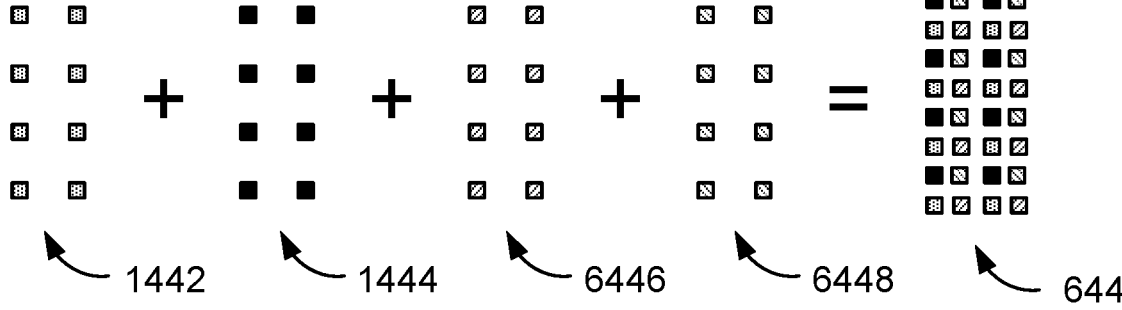
FIG. 6 includes an illustration of an organization of die transfer seats in accordance with a further implementation.

FIGS. 4 to 6 illustrate how sets of die transfer seats can be offset to achieve different arrays of die transfer seats. FIG. 4 corresponds to the array of die transfer seats 144 as illustrated in FIG. 3. In FIG. 4, the sets 1442 and 1444 are offset from each other in a horizontal direction by half of the bonding head pitch+/−2.0%, +/−1.0%, or +/−0.5%. The array of die transfer seats 144 has a 4×4 matrix configuration. FIG. 5 includes an array of die transfer seats 544, where the array of die transfer seats 544 had the same sets as the array of die transfer seats 144. In FIG. 5, the sets 1442 and 1444 are offset from each other in a vertical direction by half of the bonding head pitch+/−2.0%, +/−1.0%, or +/−0.5%. The array of die transfer seats 544 has a 2×8 matrix configuration. N is 2 for each of the arrays of die transfer seats 144 and 544.

FIG. 6 includes the sets 1442 and 1444 and further includes sets 6446 and 6448. The X-direction bonding head-matching pitch for each of sets 6446 and 6448 can be within 2.0%, 1.0%, or 0.5% of the X-direction bonding head pitch for the array of bonding heads 124, and the Y-direction bonding head-matching pitch for each of the sets 6446 and 6448 can be within 2.0%, 1%, or 0.5% of the Y-direction bonding head pitch for the array of bonding heads 124. The sets 1442 and 1444 are offset from each other in a horizontal direction by half of the bonding head pitch+/−2.0%, +/−1.0%, or +/−0.5%, and the sets 1442 and 6448 are offset from each other in a vertical direction by half of the bonding head pitch+/−+/−2.0%, +/−1.0%, or +/−0.5%. The sets 1442 and 6446 are offset from each other in a vertical direction by half of the bonding head pitch +/−2.0%, +/−1.0%, or +/−0.5% and in a vertical direction by half of the bonding head pitch+/−2.0%, +/−1.0%, or +/−0.5%. The array of die transfer seats 644 has a 4×8 matrix configuration. N is 4 for the array of die transfer seats 644.

Any of the arrays of die transfer seats 144, 544, and 644 can be configured to have an adjustable pitch that can be reversibly changed between a source-matching pitch and the bonding head-matching pitch. The array of die transfer seats 144, 544, or 644 or the carriage 146 can include motors, electrical components or the like that can be activated to move die transfer seats to achieve a desired pitch. In an implementation, the array of die transfer seats 144, 544, or 644 can be at the source-matching pitch when picking up a set of dies coupled to the source substrate chuck 122 and at the bonding head-matching pitch when transferring the dies to the array of bonding heads 124. After the dies are transferred to the array of bonding heads 124, the pitch for the array of die transfer seats 144, 544, or 644 can be changed back to the source-matching pitch before picking up more dies.

In another implementation, a source substrate chuck 122 may not be present or used. A system 700 includes an apparatus 710 and a die loading machine 720 in FIG. 7. The apparatus 710 can be the same as the apparatus 110 except that it does not have a source substrate chuck. In this implementation, the array of die transfer seats 144, 544, and 644 can be set to the bonding head-matching pitch and not be changed to a source-matching pitch during a transfer operation that can include one or more transfer cycles.

The die loading machine 720 can be used to load the die transfer seats of the apparatus 710. The die loading machine 720 can include a base 722, a positioning shaft 724, a positioning arm 726, and a die transfer head 728. The positioning shaft 724 can move in the X-direction, Y-direction, or both the X-direction and Y-direction. The positioning shaft 724 may or may not be configured to extend or retract in the Z-direction. The positioning arm 726 can be oriented and rotate along a plane defined by the X-direction and Y-direction. The positioning arm 726 may or may not be configured to extend or retract in a direction from or toward the positioning shaft 724. The die transfer head 728 can obtain one die or a plurality dies from a source substrate (not illustrated in FIG. 7) and transfer the die or plurality of dies to the plurality of die transfer seats 144 in the apparatus 710.

The terms "transfer operation" and "transfer cycle" are addressed to aid in understanding implementations as described herein. A transfer operation starts no later than loading a first set of dies on the array of die transfer seats 144, 544, or 644 and ends with a last set of dies bonded to destination bonding sites of a destination substrate overlying the destination substrate chuck 148. A transfer cycle starts no later than movement of the carriage 146 to position a set of dies at the array of die transfer seats 144 for transfer to the array of bonding heads 124 until that same particular set of dies is bonded to the destination bonding sites of the destination substrate that is coupled to the destination substrate chuck 148. A transfer operation can include one or more transfer cycles.

In an implementation, the arrays of die transfer seats 144, 544, and 644 do not need to be pick-up heads. The die transfer seats within the arrays of die transfer seats 144, 544, and 644 may or may not be able to extend in the Z-direction (toward the bridge 120 or a component coupled to the bridge 120). Dies can be loaded onto die transfer seats within any of the arrays of die transfer seats 144, 544, and 644 by a die loading machine. The die loading machine can be a robot, a pick-and-place tool, or the like. A system can be in the form of the apparatus 110, or a combination of a die loading machine and the apparatus 710 in FIG. 7. Alternatively, the dies can be loaded manually by a human operator. Thus, a system can be in the form of the apparatus 710 when the apparatus 710 is configured to have dies loaded by a human operator.

Figure 7:
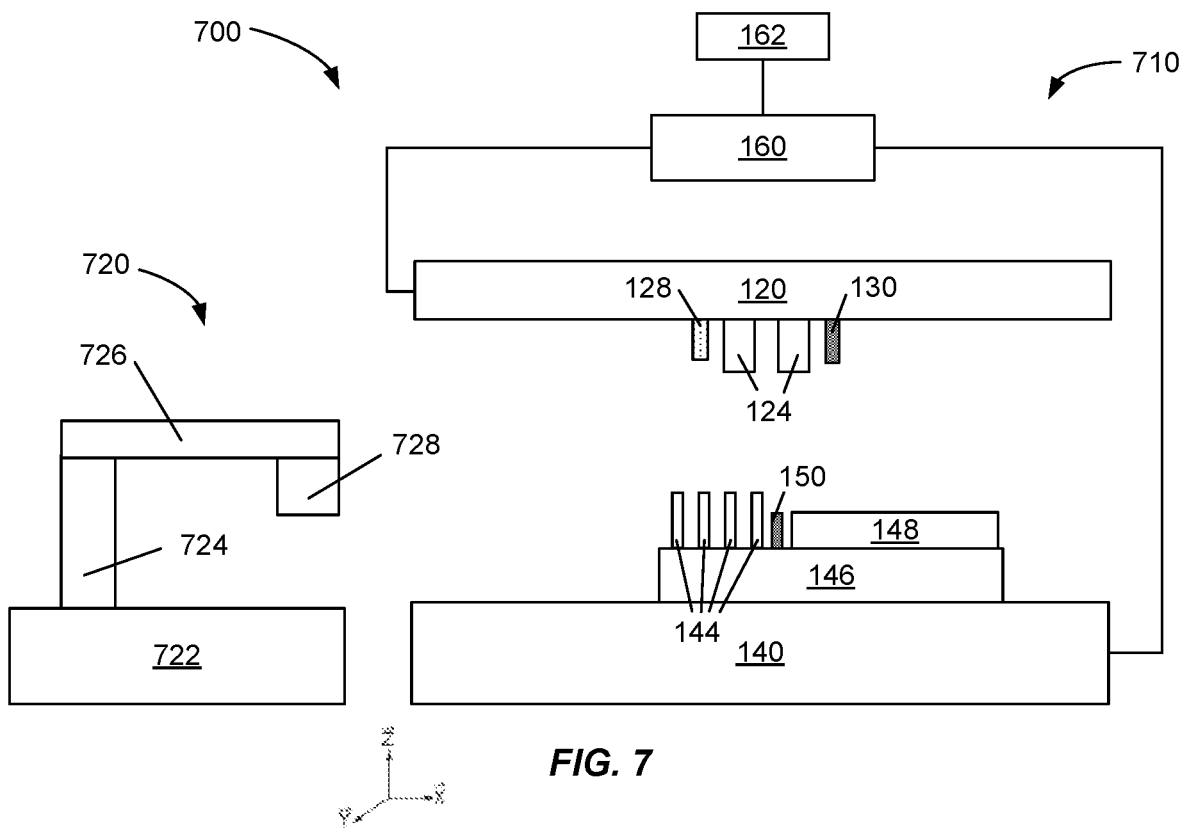
FIG. 7 includes a conceptual view of an apparatus that can be used in transferring dies from die transfer seats to a destination substrate.

The optical components 150 in FIGS. 1 and 7 are coupled to the carriage 146 and can be used during alignment operations. Four optical components 150 are illustrated in FIG. 3. In practice, more or fewer optical components 150 can be used. The optical components 150 can be part of registration and alignment hardware used in aligning the carriage 146 to the alignment reference 128, identifying dies that would be held by the array of bonding heads 124, positioning bonding heads, measuring misalignment error of dies that would be held by the array of bonding heads 124, or the like.

In the implementation illustrated in FIG. 3, the optical components 150 can be organized into an array, and more particularly, a 1×4 vector. The optical components 150 can have a pitch that is the Y-direction bonding head pitch+/−2.0%, +/−1.0%, or +/−0.5%. The optical components 150 can position and measure the misalignment error of 4 dies held by the array of bonding heads 124, for example, a column of the bonding heads in FIG. 2, during one time period and measure the misalignment error of 4 other dies held by the array of bonding heads 124, for example, the other column of the bonding heads in FIG. 2, during another time period. Thus, the optical components 150 can help to reduce processing time as compared to using a single optical component. Other configurations can be used with the optical components. The optical components 150 can be configured as a 2×2 matrix or, with 8 optical components 150, the optical components 150 can be configured as a 2×4 matrix. More or fewer optical components 150 and other organization of the optical components 150 can be used. The number and organization of the optical components 150 may or may not be dependent on the organization of the array of bonding heads 124.

The optical components 150 can be exponentially more complicated as the number of the optical components 150 increases and may or may not be more complicated depending on the particular organization of the optical components 150. For example, the optical components 150 can include lenses that are optically coupled to a mirror, prisms, gratings, light sources, fiber optics, apertures, a tube, a camera, or a combination thereof. The optical couplers can occupy significant space of the carriage 146 and be difficult to route due to other components, such as the array of die transfer seats 144 and the destination substrate chuck 148, being present within the carriage 146. After reading this specification, skilled artisans will be able to determine how many optical components 150, the organization of the optical components 150, positioning of the optical components 150 within the carriage 146.

Referring to FIGS. 1 and 3, the destination substrate chuck 148 can be coupled to the carriage 146 that is coupled to the base 140. In an implementation, the destination substrate chuck 148 is attached to the carriage 146. The destination substrate chuck 148 can hold a destination substrate having destination bonding sites. The destination substrate chuck 148 can be a vacuum chuck, pin-type chuck, a groove-type chuck, an electrostatic chuck, an electromagnetic chuck, or the like. The destination substrate chuck 148 can be heated, cooled, or both heated and cooled. The destination substrate chuck 148 can include a heater. In the same or different implementation, a fluid (not illustrated) can flow through the destination substrate chuck 148 to increase or decrease the temperature of the destination substrate chuck 148.

The apparatus 110 can be operated using a controller 160 in communication with the bridge 120, any component coupled to the bridge 120, the base 140, any component coupled to the base 140, or any combination thereof. The controller 160 can operate using a computer readable program, optionally stored in memory 162. The controller 160 can include a processor (for example, a central processing unit of a microprocessor or microcontroller), a field-programmable gate array (FPGA), an application specific integrated circuit (ASIC), or the like. The controller 160 can be within the apparatus 110. In another implementation (not illustrated), the controller 160 can be at least part of a computer external to the apparatus 110, where such computer is bidirectionally coupled to the apparatus 110. The memory 162 can include a non-transitory computer readable medium that includes instructions to carry out the actions associated with or between transfer operations. In another implementation, the bridge 120, a component coupled to the bridge 120, the base 140, or a component coupled to the base 140 can include a local controller that provides some of the functionality that would otherwise be provided by the controller 160.

While much of the hardware description has addressed the apparatus 110 in FIG. 1, the hardware description and potential design and configurations options also apply to the system 700 in FIG. 7 with the exception of the source substrate chuck 122.

Figure 8:
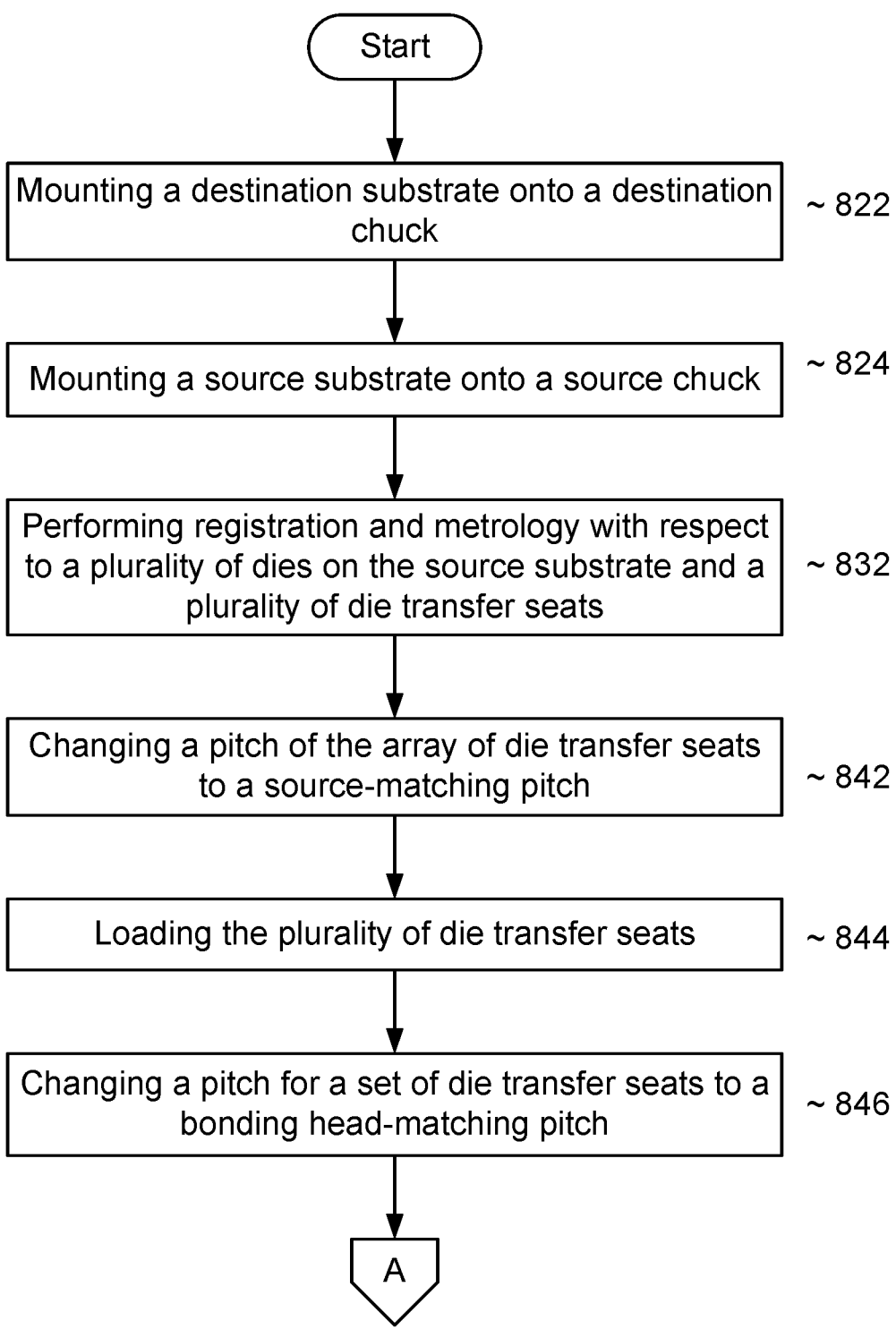
FIGS. 8 and 9 include a process flow diagram for transferring dies to destination bonding sites of a destination substrate.
Figure 9:
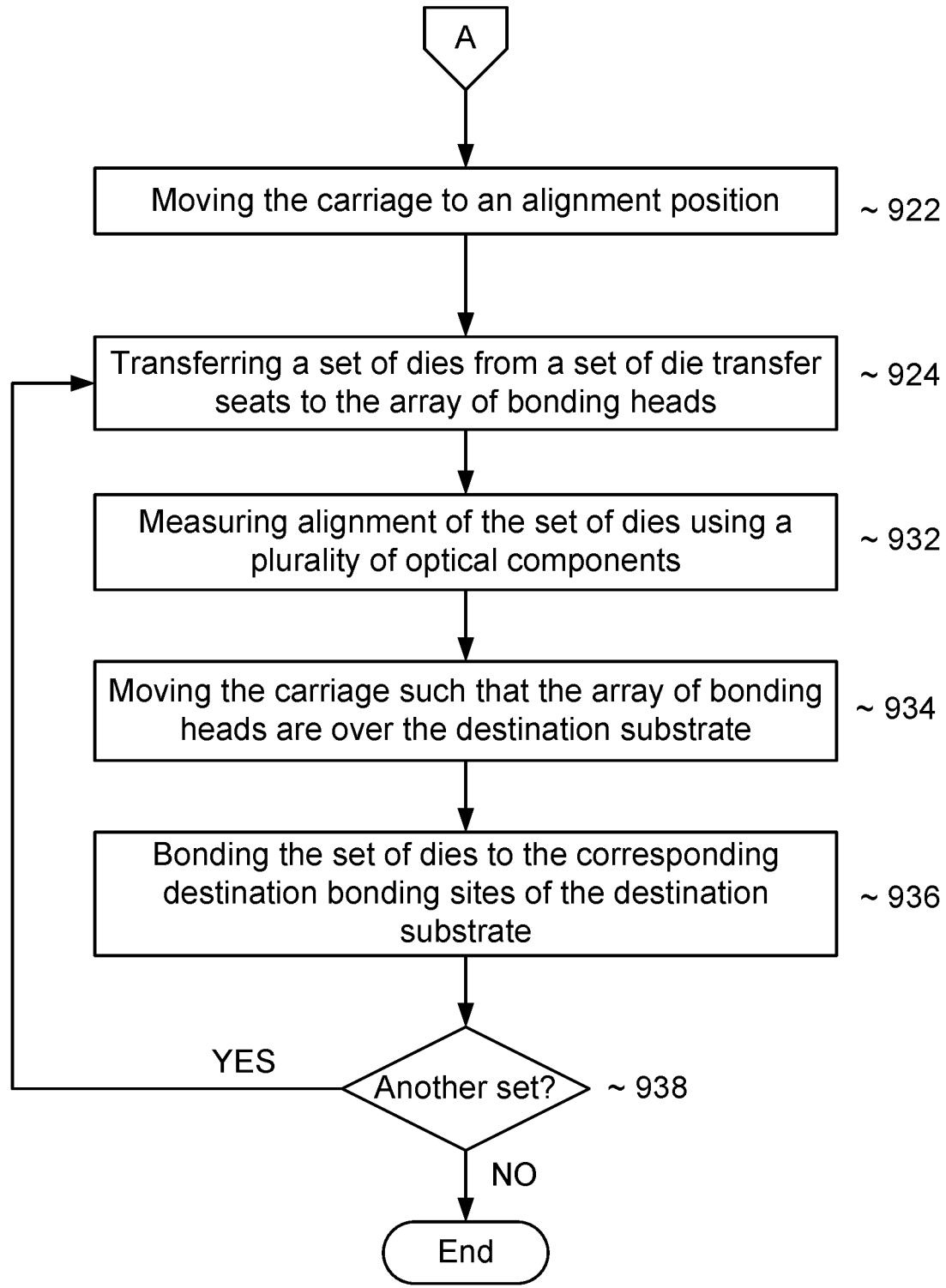

Attention is directed to methods of using the apparatus 110. FIGS. 8 and 9 includes a process flow diagram of a method that is described with respect to FIGS. 10 to 16 and 19 to 26. Some portions of the apparatus 110 illustrated in FIG. 1, such as the controller 160 and the memory 162 are not illustrated in FIGS. 10 to 16 and 19 to 26 to simplify understanding of the method. While much of the hardware and methods are described with respect to the apparatus 110, such hardware and methods also apply to the apparatus 710 except as noted within this specification.

Figure 10:
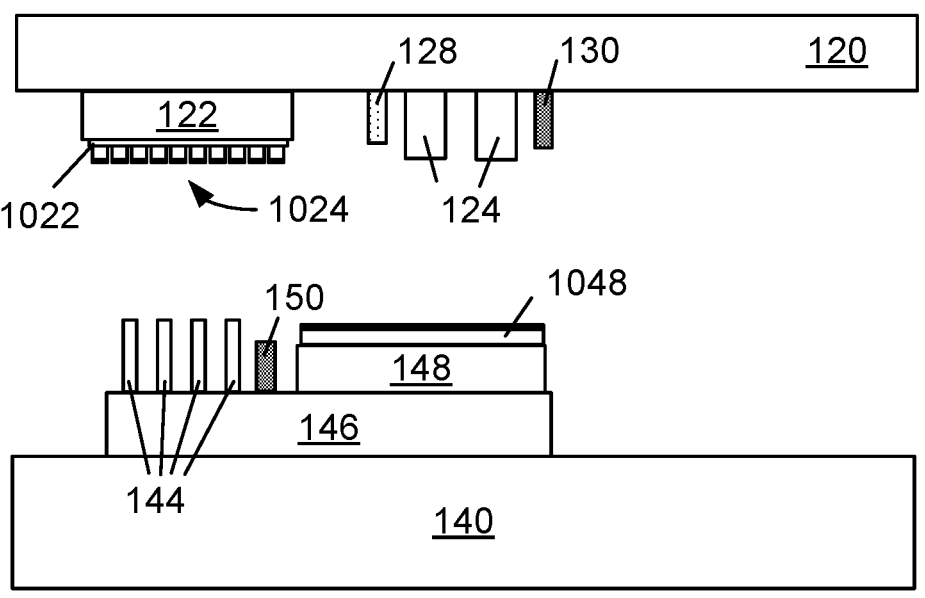
FIG. 10 includes an illustration of a side view of a portion of an apparatus after loading a source substrate over a source substrate chuck and a destination substrate over a destination substrate chuck.

The method can include mounting the destination substrate onto the destination substrate chuck at block 822 and mounting a source substrate onto a source substrate chuck at block 824 and in FIG. 8. As illustrated in FIG. 10, the carriage 146 may be moved to allow easier access to the source substrate chuck 122 and destination substrate chuck 148. The actions in blocks 822 and 824 can be performed in either order.

Referring to FIG. 10, a destination substrate 1048 is mounted over the destination substrate chuck 148. The destination substrate 1048 can include a semiconductor wafer, a package substrate, a printed wiring board, a circuit board, an interposer, or the like. Microelectronic devices may be part of the destination substrate 1048, such as a semiconductor wafer. The package substrate, the printed wiring board, the circuit board, or the interposer may or may not have dies mounted thereto. Part or all of the side of the destination substrate 1048 can be activated for hybrid bonding. In an implementation, an activated surface for hybrid bonding is illustrated as a dark band along the exposed surface of the destination substrate 1048.

A source substrate 1022 can be mounted over the source substrate chuck 122. A plurality of dies 1024 can be attached to a source substrate 1022. All or only some, not all, of the plurality of the dies 1024 are to be transferred to the destination substrate 1048. The source substrate 1022 can be an adhesive tape that may be in the form of a tape frame or tape reel, a container having a lattice that defines a matrix of regions that can hold the plurality of dies 1024, or the like. The plurality of dies 1024 can have activated bonding surfaces (illustrated as a dark band) that face the base 140 or a component coupled to the base 140.

Any or all dies within the plurality of dies 1024 can include a microprocessor, a microcontroller, a graphic processing unit, a digital signal processor, a memory die (for example, a Level 2 or Level 3 cache, a flash memory, or the like), a field programmable gate array (FPGA), a power transistor die, a power circuit die, a charge coupled-device (CCD), an image sensor, a semiconductor circuit element, or the like. The die has a device side, which has most or all of the electrical circuit elements of the die, and a back side opposite the device side. In the implementation as illustrated in FIG. 10, the back sides of the dies within the plurality of dies 1024 are disposed between the source substrate chuck 122 and the device sides of the dies. In another implementation, the device side of the dies within the plurality of dies 1024 are disposed between the source substrate chuck 122 and the back sides of the dies. The sides of the dies facing the base 140 are activated for hybrid bonding to the destination substrate 1048, and the dark band along the bottom of the dies are used to illustrate the activated surface. Any one or more of the dies can have a through substrate via (TSV) or an electrical component along the back side, and such die(s) may also include back side bonding sites that may act as future destination substrate bonding sites that may be used at a later time.

The method can further include performing registration and metrology with respect to a plurality of dies on the source substrate and a plurality of die transfer seats at block 832 in FIG. 8. Referring to FIG. 10, the registration and metrology operations can be performed with respect to the plurality of dies 1024 and the array of die transfer seats 144. Any one or more of the optical components 150 can be used to collect information regarding the plurality of dies 1024. The information from the optical components 150 can be transmitted to the controller 160 or a local controller and used to determine the source pitch for the plurality of dies 1024 coupled to the source substrate chuck 122. The source pitch can include an X-direction source pitch, a Y-direction source pitch, or both the X-direction and Y-direction source pitches. If needed or desired, the information may be used to identify or confirm the plurality of dies 1024 and the destination substrate 1048 are the correct.

Figure 11:
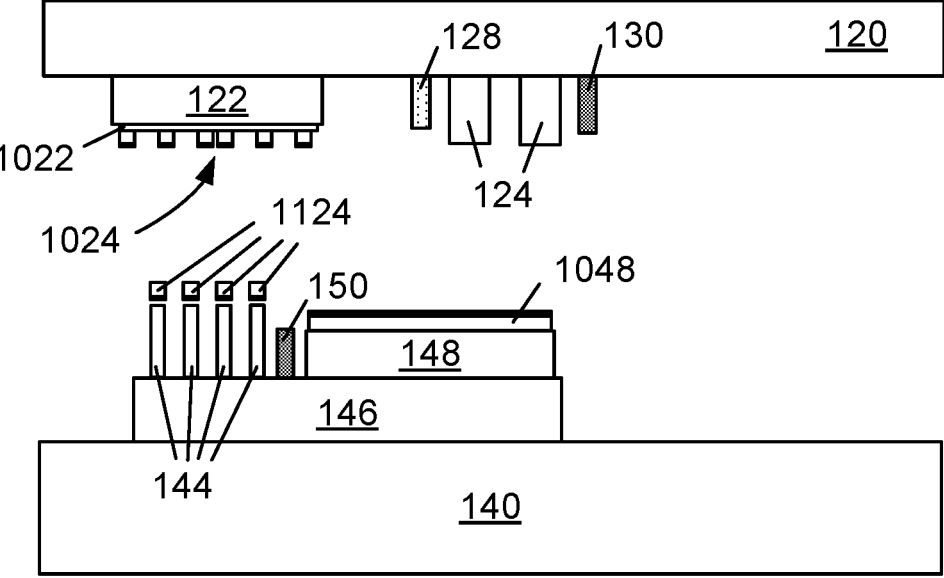
FIG. 11 includes an illustration of a side view of the apparatus of FIG. 10 after transferring dies to an array of die transfer seats.

The method can further include changing a pitch of the array of die transfer seats to a source-matching pitch at block 842 in FIG. 8. In FIG. 11, the array of die transfer seats 144 are adjusted to have the source-matching pitch. The source-matching pitch can be the same or within an allowable tolerance of the source pitch. Similar to the source pitch, the source-matching pitch can include an X-direction source-matching pitch, a Y-direction source-matching pitch, or both the X-direction and Y-direction source-matching pitches. The allowable tolerance may account for slight differences that can be attributed to the equipment or repeatability of a manufacturing process. As used herein, an allowable tolerance can be within 2.0%, 1.0%, or 0.5% of the desired value. For example, the source-matching pitch can be within 2.0%, 1.0%, or 0.5% of the source pitch.

The method can include loading the plurality of die transfer seats at block 844 in FIG. 8. Referring to FIG. 11, die chucks of the array of die transfer seats 144 can be extended toward the source substrate 1122, pick up a plurality of dies 1124, and retract the die chucks away from the source substrate 1122. Picking up the dies is a particular type of loading. Another type of loading with respect to the apparatus 710 in FIG. 7 will be described later in this specification. The dies that are picked up may be dies that are closest to each other, or one or more other dies may be between the picked-up dies, such as illustrated in FIG. 11. Dies not picked up remain coupled to the source substrate chuck 122 as illustrated in FIG. 11.

In an implementation, the die chucks of the array of die transfer seats 144 do not contact the activated surfaces of the plurality of dies 1124. Although the plurality of dies 1124 are held by the die chucks, the plurality of dies 1124 are drawn in FIG. 11 as being spaced apart from the array of die transfer seats 144 to illustrate that the activated surfaces of the dies do not contact the die transfer seats. The array of die transfer seats 144 can have a design that allows dies to be picked up along side surfaces of the dies, where the side surfaces are between the device and back sides of the dies.

If a die is too thin to be held by its sides, a backing plate can be coupled to the die. For example, a die may have a thickness less than 50 microns. A thickness of the backing plate or a combined thickness of the backing plate and die is sufficient to allow a pick-up head to pick up the backing plate or a combination of the backing plate and die without having an activated surface of the die contacting the pick-up head. The backing plate can have a thickness in a range from 100 microns to 500 microns.

The backing plate can be coupled to the die using an adhesive compound. The backing plate may be removed at a later time or remain coupled to the die in the finished electrical device. After the die is bonded to the destination substrate 1048, the backing plate may be removed. In an implementation, the adhesive compound may be deactivated by exposure to actinic radiation. The actinic radiation may be in a range from 100 nm to 1000 nm. In such an implementation, at least 70% of the actinic radiation to be transmitted through the backing plate. In another implementation, a solvent can be used to remove the adhesive compound from between the die and the backing plate.

In another implementation, a die may not have an activated surface but has a relatively fragile component along a surface that will be bonded to the destination substrate 1048, and such surface should not contact a die transfer seat within the array of die transfer seats 144. A die transfer seat as described with respect to the die having the activated surface can be used for the die with a fragile component along the surface facing the die transfer seat.

In a further implementation, the die chucks for the array of die transfer seats 144 can have a design where the die chucks contact the bottom-facing surfaces of the plurality of dies 1124. After reading this specification in its entirety, skilled artisans will be able to determine whether the array of die transfer seats 144 should or should not contact a device or back side of the dies and determine a design that meets the needs or desires for a particular application.

Figure 12:
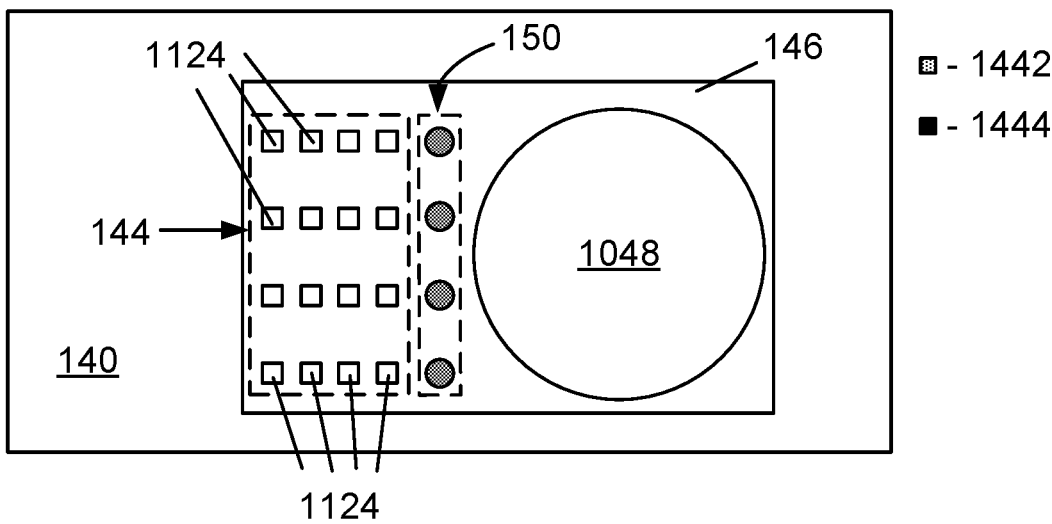
FIG. 12 includes an illustration of a top view of a base of the apparatus of FIG. 10 after transferring the dies to the array of die transfer seats.

The method can further include changing the pitch for a set of die transfer seats to a bonding head-matching pitch at block 846 in FIG. 8. The array of die transfer seats 144 includes the set of 1442 and the set 1444 as illustrated in FIG. 3. FIG. 12 includes a top view of a portion of the base 140 at this point in the process. The sets 1442 and 1444 are present but are not seen in FIG. 12 because the sets 1442 and 1444 are covered by the plurality of dies 1124. Referring to FIGS. 3 and 12, a set of dies corresponding to the set 1442 will be transferred to the destination substrate 1048 before another set of dies corresponding to the set 1444 are transferred to the destination substrate 1048.

The dies transfer seats within the sets 1442 and 1444 may or may not be at the bonding head-matching pitch. For example, the die transfer seats within both of the sets 1442 and 1444 may be at the bonding head-matching pitch at the beginning of and through the transfer operation. The action in block 846 in FIG. 8 may be omitted.

If the die transfer seats within either or both of the sets 1442 and 1444 are not at the bonding head-matching pitch, the action in block 846 can be performed for the affected the sets. During the transfer cycle, at least the die transfer seats within the set 1442 are changed to a bonding head-matching pitch during this operation if the die transfer seats are not already in the bonding head-matching pitch. If the die transfer seats within the set 1444 are not at the bonding head-matching pitch, the die transfer seats with the set 1444 may be changed to a bonding head-matching pitch at this time or before the set of dies corresponding to the set 1444 are transferred to the array of bonding heads 124. In the implementation as illustrated in FIGS. 11 and 12, the die transfer seats within the sets 1442 and 1444 are at the bonding head-matching pitch.

In a different implementation, the plurality of die transfer seats 144 may have a higher density of die transfer seats and not all of the die transfer seats may be at the bonding head-matching pitch at the same time. At least one set of die transfer seats, but not all die transfer seats within the plurality of die transfer seats 144, can be changed to the bonding head-matching for one transfer cycle, and at least one different set of die transfer seats, but not all die transfer seats within the plurality of die transfer seats 144, can be changed to the bonding head-matching for another transfer cycle.

The bonding head-matching pitch can be the same or within an allowable tolerance of the bonding head pitch for the array of bonding heads 124. The bonding head-matching pitch and the bonding head pitch can include an X-direction bonding head-matching pitch, a Y-direction bonding head-matching pitch, or both the X-direction and Y-direction bonding head-matching pitches. The allowable tolerance may account for slight differences that can be attributed to the equipment or repeatability of a manufacturing process. As used herein, an allowable tolerance can be within 2.0%, 1%, or 0.5% of the desired value. For example, the bonding head-matching pitch can be within 2.0%, 1%, or 0.5% of the bonding head pitch.

Figure 13:
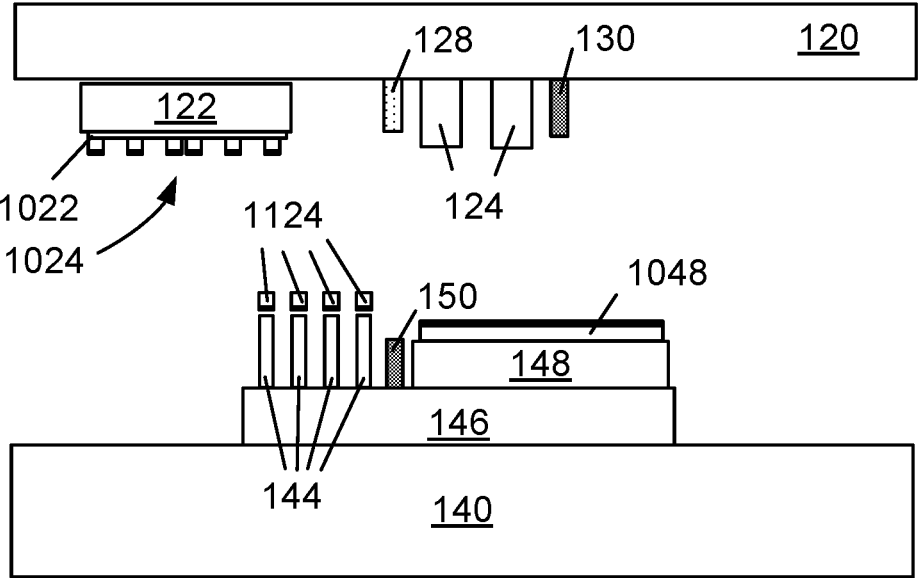
FIG. 13 includes an illustration of a side view of the apparatus of FIG. 11 when positioning the carriage using optical components under an alignment reference coupled to the bridge.
Figure 14:
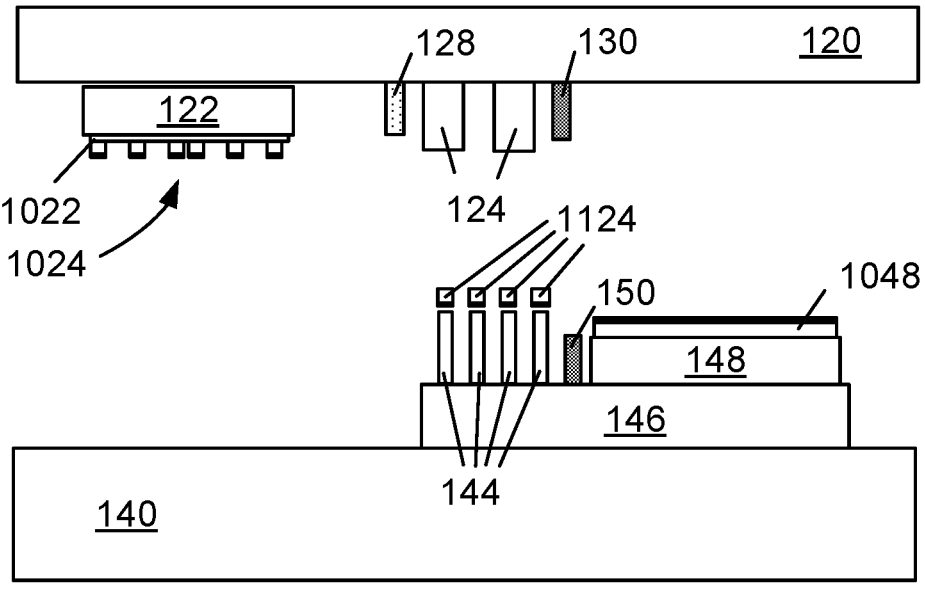
FIG. 14 includes an illustration of a side view of the apparatus of FIG. 13 after positioning a set of dies under an array of bonding head.

The method can include moving the carriage to an alignment position at block 922 in FIG. 9. In FIG. 13, the carriage 146 is moved so that the alignment reference 128 is over the optical components 150. Information collected from the optical components 150 can be received by the controller 160 or a local controller. The controller 160 or a local controller can use the information and send a signal for the carriage to move to a desired location. In an implementation and as illustrated in FIG. 14, the carriage 146 is moved so that the array of bonding heads 124 are over a set of dies corresponding to the set of die transfer seats 1442. The movement can include moving the carriage in an X-direction, a Y-direction, rotating the carriage along an X-Y plane, or a combination thereof.

Figure 15:
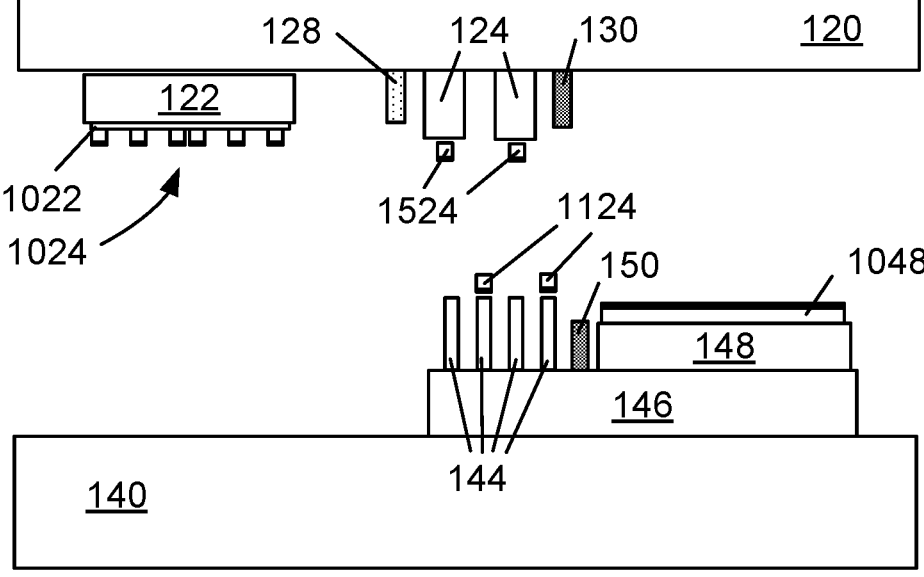
FIG. 15 includes an illustration of a side view of the apparatus of FIG. 14 after transferring the set of dies from the array of die transfer seats to the array of bonding heads.

The method can further include transferring a set of dies from a set of die transfer seats to the array of bonding heads at block 924 in FIG. 9. The die chucks for set of die transfer seats 1442 can be extended toward the array of bonding heads 124, the die chucks for the bonding heads within the array of bonding heads 124 can be extended toward the set of die transfer seats 1442, or both. FIG. 15 includes a set of dies 1524 from the plurality of dies 1124 transferred from the set of die transfer seats 1442 to the array of bonding heads 124.

The method can include measuring alignment of the set of dies using a plurality of optical components at block 932 in FIG. 9. The optical components 150 coupled to the carriage 146 may be used in positioning the set of dies 1524, measuring alignment error of the set of dies 1524, or both.

Better positioning of the dies can be accomplished by measuring an alignment error as a position of each die on each bonding head relative to an ideal position of the die on the bonding head. Information from the optical components 150 can be sent to and received by the controller 160 or a local controller. The controller 160 or a local controller can use the information to determine an alignment error and an amount of positioning of the die so that the die will be more closely aligned to its corresponding destination bonding site of the destination substrate 1048. The controller 160 or a local controller can transmit a signal, so that the position of each die is adjusted by moving the die chuck of the bonding head using the limited range of motion of the die chuck relative to its corresponding body. Thus, in an implementation, moving the die chuck allows the position of the die to be adjusted relative to the destination substrate 1048 that is held by the destination substrate chuck 148. Positioning and measuring alignment error may be performed iteratively until the alignment error is zero or an acceptably low value.

The optical components 150 may be arranged into an array based on at least part of the array of bonding heads 124. Referring to FIG. 2, the array of bonding heads 124 has two rows and four columns in a 2×4 matrix. The array of bonding heads 124 has an X-direction bonding head pitch corresponding to the rows of bonding heads and a Y-direction bonding head pitch corresponding to the columns of bonding heads. In FIG. 3, four optical components 150 are oriented along a column. The optical components 150 can be organized into a vector (1×4) that has Y-direction pitch that is substantially the same as the Y-direction pitch for the array of bonding heads 124. In a non-limiting implementation, the Y-direction for the optical components 150 may be within 2.0%, 1.0%, or 0.5% of the Y-direction bonding head pitch for the array of bonding heads 124.

Figure 16:
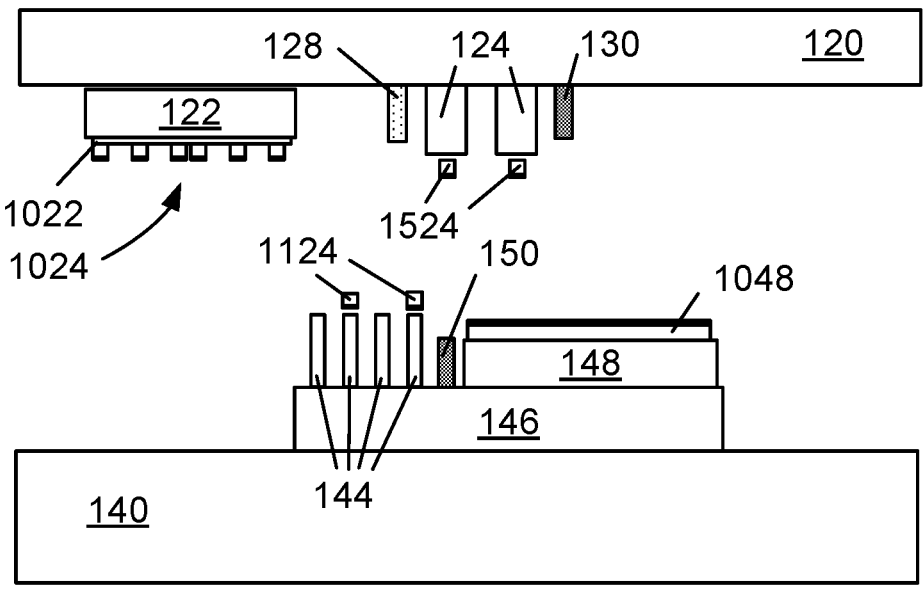
FIG. 16 includes an illustration of a side view of the apparatus of FIG. 15 when measuring alignment error between the carriage and the array of bonding heads.

With the configuration as illustrated in FIGS. 2, 3, and 16, positioning of dies, if needed, and measuring alignment errors for a column of dies within the set of dies 1524 corresponding to a column of bonding heads within the array of bonding heads 124 can be performed during a same time period, $T_{PM}$ (time for positioning, if needed, and time for measuring alignment error). Then positioning, if needed, and measurement of alignment errors for another column of dies within the set of dies 1524 corresponding to another column of bonding heads within the array of bonding heads 124 can be performed during another time period, $T_{PM}$. The values for $T_{PM}$ for the different columns of dies may be approximately the same. Therefore, for the set of dies 1524, positioning, if needed, and measuring alignment error can take twice $T_{PM}$ ($2^*T_{PM}$).

Increasing the number of optical components can reduce cycle time; however, the design of the apparatus can be substantially more complicated. Referring to FIG. 3, the optical components 150 may represent lenses where light may enter. FIG. 3 may include other optical components not illustrated in FIG. 3, such as mirrors, optical tubes, other lenses, cameras, supporting electrical components that can be used to focus a lens, transmit data collected, or the like. Such other components are referred to herein as "supplemental components." The supplemental components are present but not illustrated in FIG. 3.

The array of die transfer seats 144 may have motors that control X-direction motion, Y-direction motion, Z-direction motion, tip, tilt, rotation, or a combination of the directions. If the supplemental components are routed under the array of die transfer seats 144, the carriage 146 may need to be taller (larger in the Z-direction). If the supplemental components are routed under the destination substrate chuck 148, the supplemental components need to be positioned so that the destination substrate chuck 148 has proper mechanical support during a bonding operation. Further, the destination substrate chuck 148 may be heated or cooled, and such heating or cooling may adversely affect the supplemental components.

Figure 17:
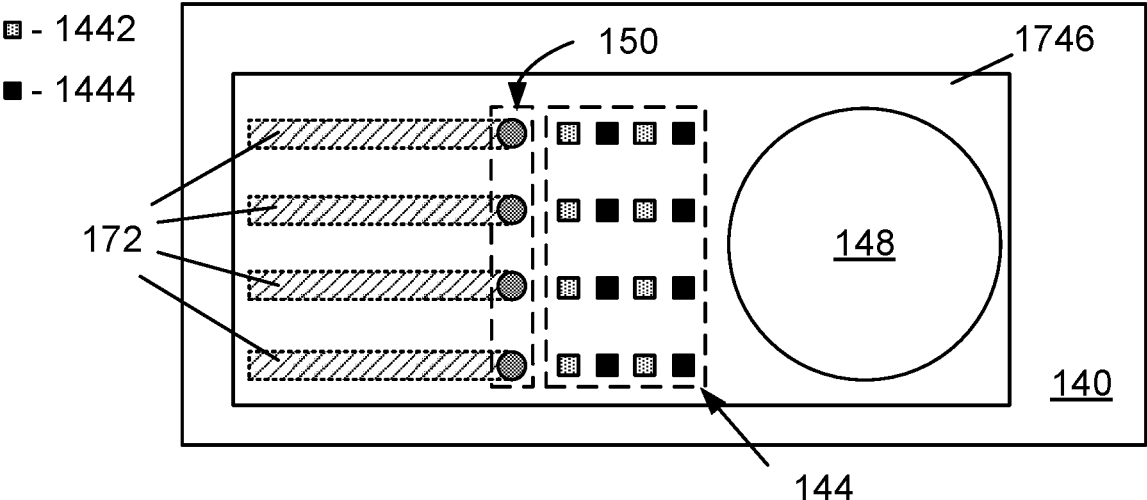
FIG. 17 includes an illustration of a top view of a base of an apparatus that illustrates an organization of optical components.

FIG. 17 illustrates a carriage 1746 that is similar to the carriage 146 except that the carriage 1746 is longer in the X-direction. Supporting components 172 are illustrated with outer boundaries that have a dashed line to designate that part or all of the supporting components are within the carriage 1746 and may or may not be visible from a top view of the carriage 1746. In the implementation illustrated in FIG. 17, the lengths of the supporting components 172 are oriented in the X-direction.

Referring to FIG. 3, if only one optical component 150 would be present, the particular optical component 150 may be near the top or the bottom of FIG. 3, the other optical components 150 would be removed, and the supplemental components 172 for the particular optical component 150 may have a length in the Y-direction. With this configuration, positioning, if needed, and measuring alignment error will be performed eight times and take $8^*T_{PM}$ to complete.

Figure 18:
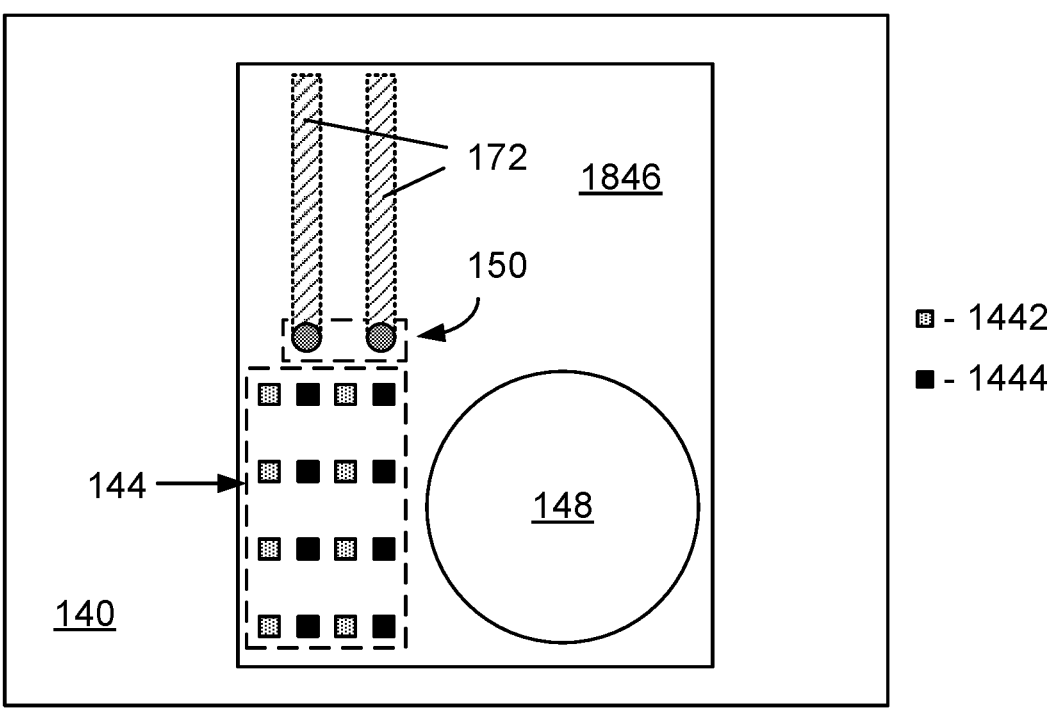
FIG. 18 includes an illustration of a top view of a base of an apparatus that illustrates another organization of optical components.

In another implementation, the X-dimension of the carriage may be limited due to the design or other considerations for the apparatus. FIG. 18 illustrates a carriage 1846 that is similar to the carriage 146 except that the carriage 1846 is shorter in the X-direction and longer in the Y-direction. The optical components 150 are organized into a 2×1 vector. Supporting components 172 are illustrated with outer boundaries that have a dashed line to designate that part or all of the supporting components are within the carriage 1846 and may or may not be visible from a top view of the carriage 1846. In the implementation illustrated in FIG. 18, the lengths of the supporting components 172 are oriented in the Y-direction. With this configuration, positioning, if needed, and measuring alignment error will be performed four times and take $4^*T_{PM}$ to complete.

After reading this specification, skilled artisans will understand that a tradeoff between cycle time and apparatus complexity may exist. Skilled artisans will be able to determine a configuration and design for the optical components 150 and the supplemental components 172 to meet the needs or desires for a particular application.

Figure 19:
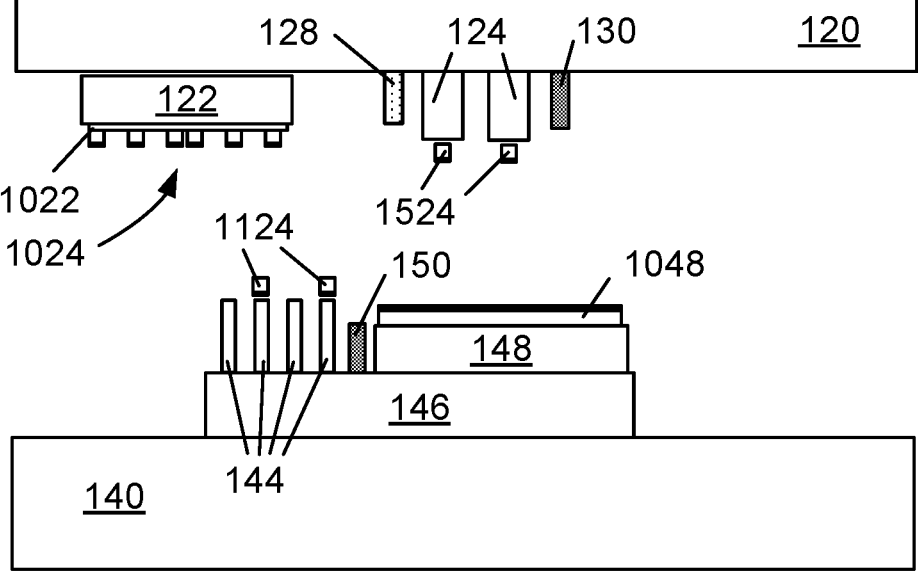
FIG. 19 includes an illustration of a side view of the apparatus of FIG. 16 after positioning the set of dies over the destination substrate.

The description of the method continues with the apparatus as described with respect to the apparatus 110 in FIGS. 1 to 3. The method can include moving the carriage such that the array of bonding heads are over the destination substrate at block 934 in FIG. 9. In FIG. 19, the carriage 146 is moved so that the set of dies 1524 are over destination bonding sites for the destination substrate 1048.

The method can further include bonding the set of dies to the corresponding destination bonding sites of the destination substrate at block 936 in FIG. 9. The die chucks for the array of bonding heads 124 can be extended toward the destination substrate 1048, the destination substrate chuck 148 can be extended toward the array of bonding heads 124, or both. Pressure is exerted to bond the set of dies 1524 to corresponding destination bonding sites of the destination substrate 1048 in FIG. 20. In an implementation, the bonds can be oxide-to-oxide bonds. The pressure during bonding can be in a range 0.5 N/cm$^2$ to 20 N/cm$^2$. The bonding can be performed at room temperature (for example, at a temperature in a range from 20° C. to 25° C.) or higher. Bonding is performed at a temperature less than a subsequent anneal to expand conductive metal within the dies and at the destination bonding sites. The temperature and pressure may be limited depending on films present during bonding or components within the apparatus 110. For example, the temperature may be no higher than approximately 200° C. After reading this specification, skilled artisans will be able to determine the pressure and temperature used for bonding.

Figure 21:
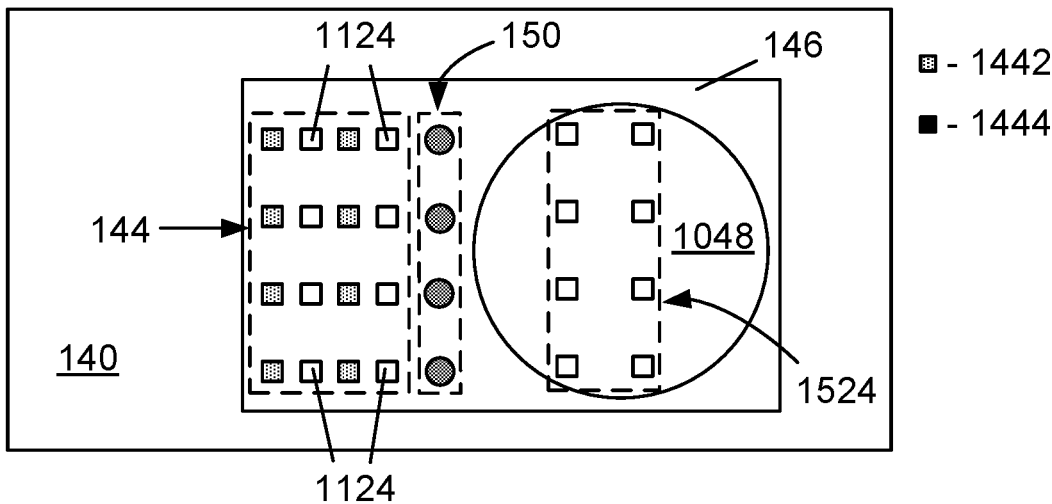
FIG. 21 includes an illustration of a top view of the base of the apparatus of FIG. 20 after bonding the set of dies to the destination bonding sites of the destination substrate.

FIG. 21 includes a top view of the base 140 and components coupled to the base 140 after the set of dies 1524 are bonded to corresponding destination bonding sites of the destination substrate 1048. The set of dies 1524 were previously over the set of die transfer seats 1442 (FIG. 12), and at this point in the method, the set of die transfer seats 1442 are visible in FIG. 21. An other set of die transfer seats 1444 are present but not visible because the other set of die transfer seats 1444 is covered by the remaining dies within the plurality of dies 1124. At this point in the method, one transfer cycle has been completed.

A determination is made whether another set of dies is to be transferred to the destination substrate at decision diamond 938 in FIG. 9. If no more dies are to be transferred ("NO" branch), the transfer operation is completed, and the method of transferring dies ends.

If more dies are to be transferred ("YES" branch from decision diamond 938 in FIG. 9), the method continues starting at block 924 in FIG. 9. Referring to FIGS. 3 and 21, the dies overlying the other set of die transfer seats 1444 are to be transferred to the destination substrate 1048. Because the plurality of dies 1124 were previously loaded before the set of dies 1524 were transferred to the array of bonding heads 124, operations described with respect to blocks 832, 842, 844, and 846 in FIG. 8 and block 922 in FIG. 9 do not need to be repeated. The carriage 146 can be moved into a position such that the dies within the plurality of dies 1124

Figure 22:
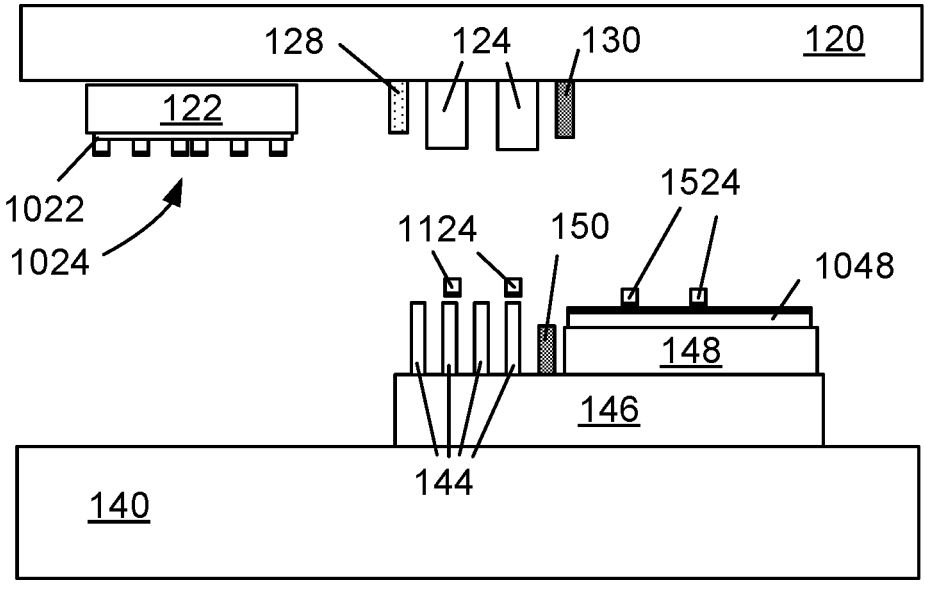
FIG. 22 includes an illustration of a side view of the apparatus of FIG. 21 after positioning another set of dies under the array of bonding head.

17 corresponding the other set of die transfer seats 1444 are under the array of bonding heads 124 as illustrated in FIG. 22.

Figure 23:
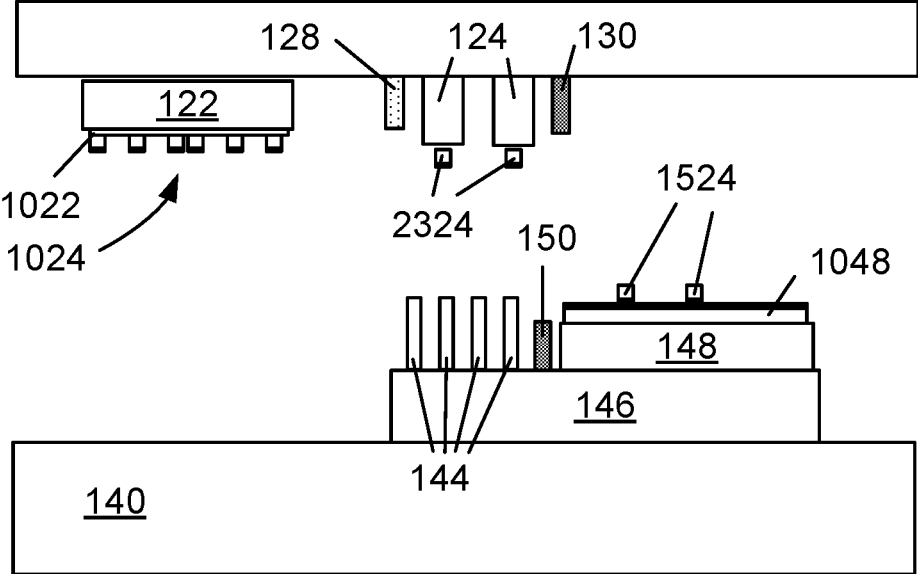
FIG. 23 includes an illustration of a side view of the apparatus of FIG. 22 after transferring the other set of dies from the array of die transfer seats to the array of bonding heads.

The method can further include transferring a set of dies from a set of die transfer seats to the array of bonding heads at block 924 in FIG. 9. The die chucks for the other set of die transfer seats 1444 can be extended toward the array of bonding heads 124, the die chucks for the bonding heads within the array of bonding heads 124 can be extended toward the other set of die transfer seats 1444, or both. FIG. 23 includes a set of dies 2324 from the plurality of dies 1124 transferred from the other set of die transfer seats 1444 to the array of bonding heads 124.

The method can include measuring alignment of the set of dies using a plurality of optical components at block 932 in FIG. 9. Positioning, if needed, and measuring alignment error can be performed for the set of dies 2324 can be performed using any of the actions and configurations as previously described with respect to the set of dies 1524. Positioning, if needed, measuring alignment error, and the particular configuration of optical components 150 for the set of dies 2324 can be the same or different as positioning, if needed, measuring alignment error, and the particular configuration of optical components 150 for the set of dies 1524.

Figure 24:
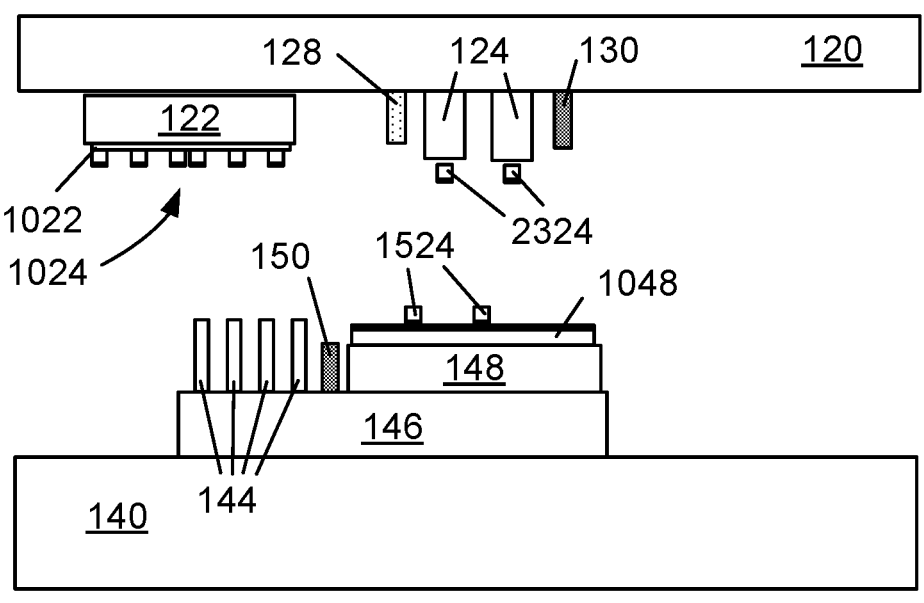
FIG. 24 includes an illustration of a side view of the apparatus of FIG. 23 after positioning the other set of dies over the destination substrate.

The method can include moving the carriage such that the array of bonding heads are over the destination substrate at block 934 in FIG. 9. In FIG. 24, the carriage 146 is moved so that the set of dies 2324 are over destination bonding sites for the destination substrate 1048.

The method can further include bonding the set of dies to the corresponding destination bonding sites of the destination substrate at block 936 in FIG. 9. The die chucks for the array of bonding heads 124 can be extended toward the destination substrate 1048, the destination substrate chuck 148 can be extended toward the array of bonding heads 124, or both. Pressure is exerted to bond the set of dies 2324 to corresponding destination bonding sites of the destination substrate 1048. In an implementation, the bonds can be oxide-to-oxide bonds. The pressure during bonding can be in a range 0.5 N/cm² to 20 N/cm². The bonding can be performed at room temperature (for example, at a temperature in a range from 20° C. to 25° C.) or higher. Bonding is performed at a temperature less than a subsequent anneal to expand conductive metal within the dies and at the destination bonding sites. The temperature and pressure may be limited depending on films present during bonding or components within the apparatus 110. For example, the temperature may be no higher than approximately 200° C. After reading this specification, skilled artisans will be able to determine the pressure and temperature used for bonding.

Figure 25:
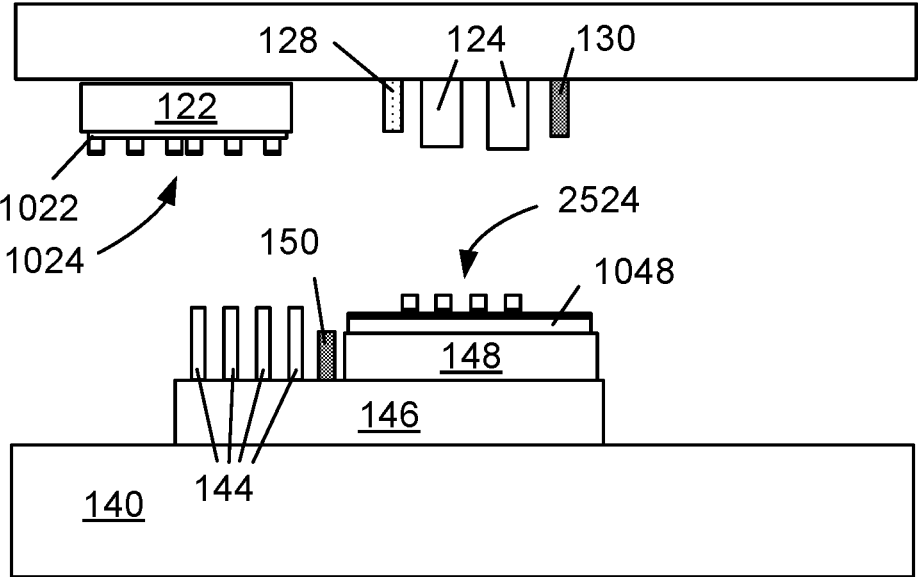
FIG. 25 includes an illustration of a side view of the apparatus of FIG. 24 after bonding the other set of dies to other destination bonding sites of the destination substrate.
Figure 26:
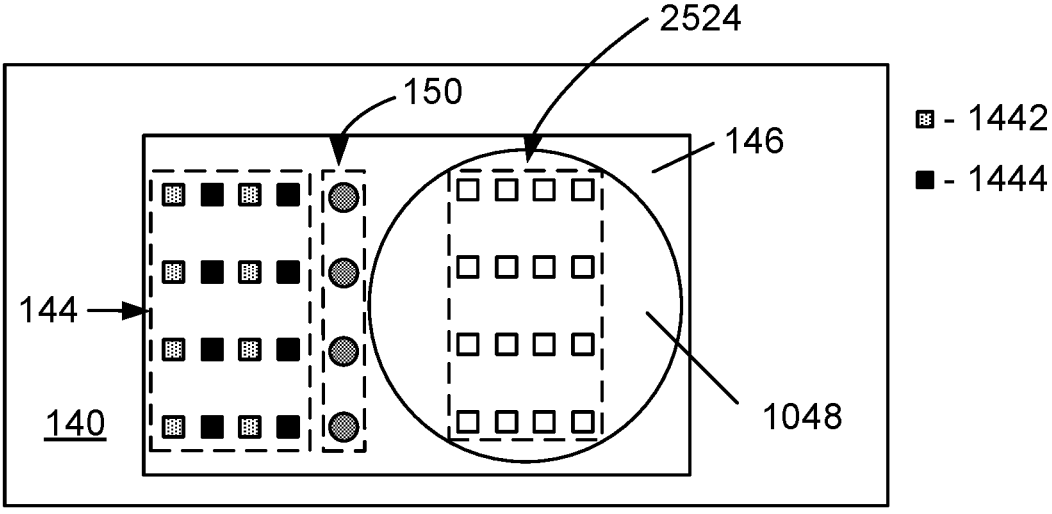
FIG. 26 includes an illustration of a top view of the base of the apparatus of FIG. 25 after bonding the other set of dies to the other destination bonding sites of the destination substrate.

FIG. 25 and FIG. 26 includes a side view and a top view, respectively, of the base 140 and components coupled to the base 140 after a plurality of dies 2524 are bonded to corresponding destination bonding sites for the destination substrate 1048. The plurality of dies 2524 include the sets of dies 1524 and 2324. The sets of die transfer seats 1442 and 1444 are visible as seen in FIG. 26. At this point in the method, another transfer cycle has been completed.

A hybrid bonding process can include three steps that include a bonding operation, a first anneal to cause the metal within the dies and at the destination bonding sites to expand and contact each other, and a second anneal to cause metal atoms to cross the metal-metal interface and reduce contact resistance. The method previously described with respect to the flow chart in FIGS. 8 and 9 and as described and illustrated in FIGS. 10 to 16 and 19 to 26 can correspond to the bonding operation of a hybrid bonding process. The destination substrate 1048 can be removed from the apparatus 110 or moved to a different portion of the apparatus 110 or a different tool to perform the anneal operations.

The method as described with respect to the process flow diagram in FIGS. 8 and 9 does not need to be performed in the order as presented in FIGS. 8 and 9. For example, mounting the destination substrate in block 822 may be performed before or after mounting the source substrate in block 824. Further, mounting the destination substrate in block 822 and mounting the source substrate in block 824 may be performed such that at least portions of the mounting actions are performed at the same time. Similar to blocks 822 and 824, the operations described with respect to blocks 846 (changing pitch for the die transfer seats) and 922 (moving the carriage) in FIG. 9 may be performed in either order or such that at least portions of the actions for blocks 846 and 922 are performed at the same time.

The apparatus 710 in FIG. 7 can be used to transfer a plurality of dies from the array of die transfer seats 144 to destination bonding sites of the destination substrate that overlies the destination substrate chuck 148. Reference will be made to the process flow diagram in FIGS. 8 and 9 as appropriate. The order of some operations and the particular actions for an operation may be different for the apparatus 710. Further, FIGS. 10 to 26 may apply to the apparatus 710 except that the source substrate chuck 122, the source substrate 1022, and the plurality of dies 1024 would not be present.

The array of die transfer seats 144 do not need to be at a source-matching pitch because there is no source substrate above the array of die transfer seats 144. The array of die transfer seats 144 may already be at the bonding head-matching pitch. Dies can be loaded onto the array of die transfer seats 144 by a human operator or by a die loading machine, such as the die loading machine 720. The die loading machine can be a robot, a pick-and-place tool, or the like.

If a die loading machine is used, the operation in block 832 can be modified for the die loading machine. The die loading machine may include one or more optical components similar to any of the optical components 130 and 150. The one or more optical components of the die loading machine can be used when performing registration and metrology with respect to the die loading machine and the plurality of die transfer seats 144. The registration and metrology is similar to block 832 of FIG. 8 as previously described.

The method can then include loading the plurality of die transfer seats at block 844 in FIG. 8. The dies for the plurality of die transfer seats 144 may be transferred individually (one-by-one), in sets (one set of dies for the set of die transfer seats 1442 and another set of dies for the die transfer seats 1444), all dies for the plurality of die transfer seats 144 at the same time, or in another grouping of dies.

The operation is block 846 may or may not need to be performed, depending on whether the plurality of die transfer seats 144 of a set thereof may already be at the bonding head-matching pitch. The remainder of the method including the operations listed in blocks 922, 924, 932, 934, 936, and decision diamond 938 are performed for the apparatus 710 in substantially the same manner as the apparatus 110.

EXAMPLES

Examples described below are provided to demonstrate that unit per hour throughputs using different designs of apparatuses that will be described in more detail later in this specification.

Table 1 below includes actions and the time each of the actions take. A brief description of the actions follows Table 1.

TABLE 1

Times for Actions

| Action ID | Action Description | Time (s) |
|---|---|---|
| A | Move carriage to source substrate location | 0.85 |
| B | Load dies from source substrate onto die transfer seats | 1 |
| 1 | Move carriage to bonding head location | 0.75 |
| 2 | Transfer set of dies from die transfer seats to bonding heads | 0.75 |
| 3 | Move carriage to alignment position for a die, column of dies, or row of dies, as applicable | 0.85 |
| 4 | Alignment error measurement | 0.1 |
| 5 | Step to next die, next column of dies, or row of dies, as applicable | 0.5 |
| 6 | Step to bonding position (and alignment correction) | 0.85 |
| 7 | Z movement down + bond + Z movement up | 0.85 |

Action A corresponds to the carriage 146 moving to a location that is under the source substrate 1022 in FIG. 10. Action B is loading dies onto the plurality of die transfer seats 144 in FIG. 11. In the Examples, the plurality of die transfer seats 144 is a plurality of pick-up heads, and the plurality of pick-up head pick up a plurality of dies 1124 from the source substrate 1022.

Action 1 is moving the carriage 146 to the bonding head location. Part of the process can be using the optical components 150 and the alignment reference 128 in FIG. 13 and moving the carriage 146 into position to transfer a set of dies 1524 in FIG. 14. Action 2 is transferring a set of dies from a set of die transfer seats 1442 to the array of bonding heads 124. An example can be the set of dies 1524 that are transferred to the array of bonding heads in FIG. 15.

Action 3 is moving the carriage to alignment position for a die, a column of dies, or a row of dies, Action 4 is measuring alignment error, and Action 5 is step to next die, next column of dies, or row of dies, as applicable. These actions are generally described with respect to FIG. 16.

Actions 3 to 4 may depend on the number and organization of optical components 150 on the carriage 146. When the carriage 146 has only one optical component 150 and the array of bonding heads 124 has a 2×4 organization, positioning and alignment will be performed 8 separate times, take a time of $8*T_{PM}$.

When the optical components 150 has a 1×4 organization, such as seen in FIGS. 3 and 12, positioning and alignment will be performed on a column-by-column basis. In other words, the optical components 150 are used in performing positioning and measuring alignment errors for dies coupled to a column of bonding heads within the array of bonding heads 124 before positioning and measuring alignment errors for dies coupled to a different column of bonding heads within the array of bonding heads 124. For the dies within each column, positioning and measuring alignment error can be performed during one time period. With the array of bonding heads 124 and the optical components 150 in a 1×4 organization, the positioning and alignment will be performed during 2 separate times, one for each column, and take a time of $2*T_{PM}$.

When the optical components 150 has a 2×1 organization, such as seen in FIG. 18, positioning and alignment will be performed on a row-by-row basis. In other words, the optical components 150 are used in performing positioning and measuring alignment errors for dies coupled to a row of bonding heads within the array of bonding heads 124 before positioning and measuring alignment errors for dies coupled to a different row of bonding heads within the array of bonding heads 124. For the dies within each row, positioning and measuring alignment error can be performed during one time period. With the array of bonding heads 124 and the optical components 150 in a 2×1 organization, the positioning and alignment will be performed during 4 separate times, one for each row and take a time of $4*T_{PM}$.

The number and organization of the optical components 150 can be selected to increase throughput, but the increased throughput may substantially increase the design complexity associated the supplemental components 172 that may be present, as described with respect to FIGS. 17 and 18.

Figure 20:
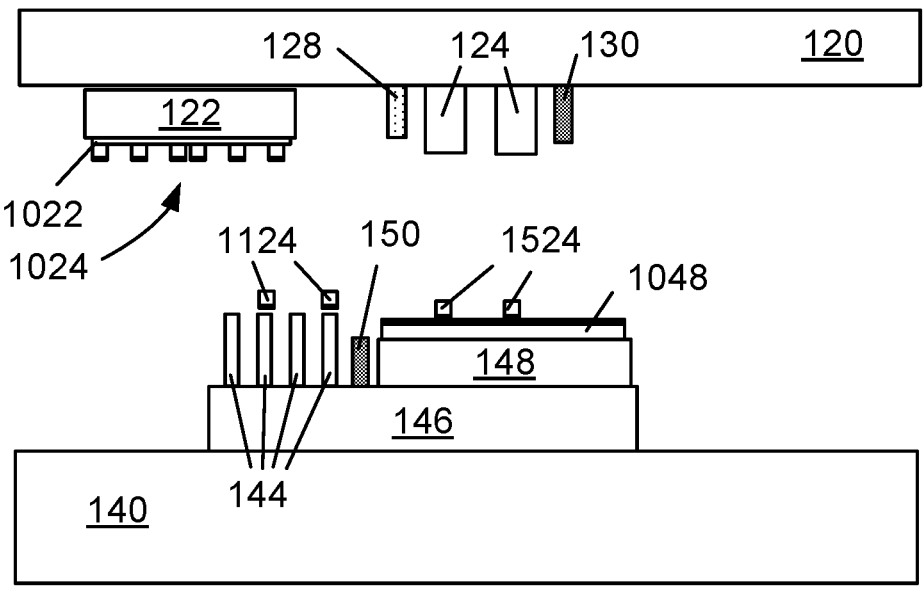
FIG. 20 includes an illustration of a side view of the apparatus of FIG. 19 after bonding the set of dies to destination bonding sites of the destination substrate.

Action 6 is stepping to the bonding position (and make an alignment correction, if needed or desired). Action 6 is illustrated and described with respect to FIG. 19. Action 7 is the bonding operation. Action 7 can include Z-direction movement down as the array of bonding heads 124 moves the dies to destination bond sites of the destination substrate 1048, performing the bonding, and Z-direction movement up as the array of bonding heads 124 moves away from the destination substrate 1048. FIGS. 20 and 21 include side and top views after the set of dies 1524 are bonded to destination bonding sites of the destination substrate 1048.

Actions 1 to 7 are repeated for another set of dies that are to be bonded to other destination bonding sites of the destination substrate. The actions are generally illustrated and described with respect to FIGS. 22 to 26.

Examples 1 to 4 compare different apparatus configurations with respect to throughput. All of the examples have the array of bonding heads with a 2×4 organization and includes 8 bonding heads (M=8). The optical components 150 have a 1×4 organization and include 4 optical components. The utilization rate of the apparatuses addressed below is 80%. In Examples 1 to 4, the die transfer seats are pick-up heads, which is a particular type of die transfer seat.

Example 1 is similar to the apparatus 110 except that the plurality of die transfer seats (pick-up heads in the Examples) are on a separate carriage as compared to the optical components 150 and the destination substrate chuck 148. The plurality of die transfer seats have the same number and organization as the array of bonding heads 124.

Example 2 is similar to the apparatus 110 except that the plurality of pick-up heads can include the set of die transfer seats 1442 or 1444, but not both sets. The number of dies transfer seats divided by the number of bonding heads (M) within the array of bonding heads 124 is one, (N=1).

Example 3 is represented by the apparatus 110. The plurality of pick-up heads can be organized into a 4×4 matrix as illustrated with the set of die transfer seats 144 in FIG. 4. Alternatively, the plurality of pick-up heads can be organized into a 2×8 matrix as illustrated with the set of die transfer seats 544 in FIG. 5. For each of the 4×4 and 2×8 matrices, the number of dies transfer seats divided by the number of bonding heads (M) within the array of bonding heads 124 is two, (N=2).

Example 4 is similar to the apparatus 110 except that the plurality of die transfer seats 644 (in FIG. 6) can include the sets of die transfer seats 1442, 1444, 6446, and 6448. The plurality of die transfer seats 644 is organized into a 4×8 matrix. The number of dies transfer seats in the plurality of die transfer seats 644 divided by the number of bonding heads (M) within the array of bonding heads 124 is four, (N=4).

Table 2 includes information on each of the Examples, the value of N, actions for each cycle, cycle time, and throughput.

TABLE 2

| Throughput Comparisons for Examples 1 to 4 | | | | |
|---|---|---|---|---|
| Example | N | Actions for each cycle | Cycle time (s) | Throughput (units/hour) |
| Example 1 | Dual carriage | 1 + 2 + 3 + 4 + (5 + 4) + 6 + 7 | 4.75 | 4851 |
| Example 2 | 1 | (A + B) + 1 + 2 + 3 + 4 + (5 + 4) + 6 + 7 | 6.60 | 3491 |
| Example 3 | 2 | (A + B)/2 + 1 + 2 + 3 + 4 + (5 + 4) + 6 + 7 | 5.68 | 4060 |
| Example 4 | 4 | (A + B)/4 + 1 + 2 + 3 + 4 + (5 + 4) + 6 + 7 | 5.21 | 4420 |

Example 1 has the highest throughput at 4851 units/hour. In Example 1, Actions A and B can be performed while Actions 1 to 7 are being performed. Actions 1 to 7 take longer to complete as compared to Actions A and B. Thus, Actions 1 to 7 are the rate limiting actions for Example 1.

The dual carriage configuration in Example 1 can complicate the method. The carriage with the plurality of die transfer seats and the other carriage with the optical components and destination substrate chuck are physically coupled to each other via the base of the apparatus. The carriage with the plurality of die transfer seats may move independently of the other carriage. The other carriage may be performing an operation, such as alignment, bonding, or another action where high accuracy is needed while the carriage with the plurality of die transfer seats is starting, stopping, or the pick-up heads are extending toward the source substrate chuck 122, picking up dies from the source substrate 1022, or retracting the pick-up heads from the source substrate chuck 122.

The vibration or another motion caused actions being performed by the plurality of pick-up heads or its corresponding carriage can be transmitted to the other carriage with the optical components and the destination substrate chuck 148. Such transmitted vibration or other motion can interfere with the alignment of or placement of dies onto the destination substrate 1048. Misalignment tolerance with a bonding operation in hybrid bonding is substantially smaller than other ways of connecting dies, such as wire bonding or flip-chip packaging. As dimensions continue to shrink, the misalignment tolerance will likewise decrease. Although Example 1 has the highest throughput, the dual carriage design may not be an acceptable choice as misalignment tolerance continues to decrease.

Regarding Example 2, the value of N is 1. The carriage returns to the source loading position after each set of dies are bonded to the destination bonding sites of the destination substrate 1048. The frequent trips to and from the source location to obtain more dies significantly adversely affects the throughput. Example 2 has a throughput of 3491 dies per hour. If the minimum throughput is 4000 dies/hours, Example 2 is an unacceptable alternative.

In Example 3, the value of N is 2, and the throughput is 4060 units/hour. In Example 4, the value of N is 4, and the throughput is 4420 units/hour. The throughputs in Examples 3 and 4 are over 4000 units/hour and are acceptable.

As the value of N continues to increase, the throughput will be closer to the dual carriage configuration. In theory, N can be a very high number; however, in practice, the manufacturing cost of the apparatus, design complexity of the apparatus, or both may increase at an exponential rate with a linear increase of N. After reading this specification, skilled artisans will be able to determine a value for N that achieves a relatively high throughput without causing the manufacturing cost to become too high or the design from becoming too complex.

Implementations as described herein can allow a relatively high throughput of dies for a bonding method and still meet the increasingly stringent dimensional requirements for hybrid bonding. A carriage having a plurality of die transfer seats and a destination substrate chuck can help to reduce vibration or other motion during alignment and bonding as compared to a carriage having the plurality of die transfer seats and another carriage having a destination substrate chuck. The reduced vibration or other movement can allow the apparatus to be used as dimensional requirements for hybrid bonding continue to decrease, whereas a dual carriage configuration may no longer be able to meet the dimensional requirements.

The number of die transfer seats can be selected so that an acceptable throughput is achieved. As the value of N (number of die transfer seats/number of bonding heads) increases, throughput becomes closer to the dual carriage apparatus. Skilled artisans will be able to determine a value for N that provides a good balance between throughput and cost and mechanical complexity of the apparatus.

Note that not all of the activities described above in the general description or the examples are required, that a portion of a specific activity may not be required, and that one or more further activities can be performed in addition to those described. Still further, the order in which activities are listed is not necessarily the order in which they are performed.

Benefits, other advantages, and solutions to problems have been described above with regard to specific implementations. However, the benefits, advantages, solutions to problems, and any feature(s) that can cause any benefit, advantage, or solution to occur or become more pronounced are not to be construed as a critical, required, or essential feature of any or all the claims.

The specification and illustrations of the implementations described herein are intended to provide a general understanding of the structure of the various implementations. The specification and illustrations are not intended to serve as an exhaustive and comprehensive description of all of the elements and features of apparatus and systems that use the structures or methods described herein. Separate implementations can also be provided in combination in a single implementation, and conversely, various features that are, for brevity, described in the context of a single implementation, can also be provided separately or in any subcombination. Further, reference to values stated in ranges includes each and every value within that range. Many other implementations can be apparent to skilled artisans only after reading this specification. Other implementations can be used and derived from the disclosure, such that a structural substitution, logical substitution, or another change can be made without departing from the scope of the disclosure. Accordingly, the disclosure is to be regarded as illustrative rather than restrictive.

What is claimed is:
1. A system, comprising:
a first substrate chuck;
an array of M bonding heads;
an array of N*M die transfer seats; and
a carriage, wherein the first substrate chuck and the array of N*M die transfer seats are positioned along the carriage, each of N and M is a whole number greater than 1 M is a number of bonding heads, and N is (a number of die transfer seats/the number of bonding heads).

2. The system of claim 1, wherein N is at most 10.

3. The system of claim 1, further comprising a bridge and a component coupled to the bridge, wherein the array of N*M die transfer seats include bodies and die chucks, and the bridge or the component coupled to the bridge is closer to the die chucks than to the bodies.

4. The system of claim 3, wherein bonding head chucking surfaces of the array of M bonding heads are oriented to face the first substrate chuck when the carriage is under the array of M bonding heads.

5. The system of claim 1, further comprising an alignment reference and a plurality of optical components positioned along the carriage, wherein the plurality of optical components are oriented to face the alignment reference when the carriage is in a third position.

6. The system of claim 5, wherein the array of M bonding heads has an A*B matrix organization, and the plurality of optical components has A optical components, B optical components, or the A*B matrix organization, wherein each of A and B is a whole number.

7. The system of claim 1, further comprising a second substrate chuck, wherein the second substrate chuck is closer to die chucks of the N*M die transfer seats than to bodies of the N*M die transfer seats when the carriage is over the array of N*M die transfer seats.

8. The system of claim 7, wherein the array of N*M die transfer seats is an array of N*M pick-up heads.

9. The system of claim 1, further comprising a die loading machine configured to load die transfer seats within the N*M array of die transfer seats.

10. The system of claim 1, wherein:
the array of M bonding heads has a bonding head pitch,
the N*M die transfer seats includes a first set of die transfer seats and a second set of die transfer seats, and
die transfer seats of each of the first set of die transfer seats and the second set of die transfer seats are at pitches that are within 2.0% of the bonding head pitch.

11. The system of claim 10, wherein the second set of die transfer seats are offset from the first set of die transfer seats in a first direction by a first distance that is within 2.0% of 0.5 times the bonding head pitch.

12. The system of claim 11, wherein:
the N*M die transfer seats further includes a third set of die transfer seats and a fourth set of die transfer seats, and
die transfer seats of each of the third set of die transfer seats and the fourth set of die transfer seats are at pitches that are within 2.0% of the bonding head pitch.

13. The system of claim 12, wherein:
the third set of die transfer seats are offset from the first set of die transfer seats in a second direction by a second distance that is within 2.0% of 0.5 times the bonding head pitch, wherein the second direction is perpendicular to the first direction, and
the fourth set of die transfer seats are offset from the first set of die transfer seats in the first direction by the first distance in the first direction and in the second direction by the second distance.

14. The system of claim 1, further comprising a base and a bridge spaced apart from the base, wherein the carriage is coupled to the base, and the array of M bonding heads is coupled to the bridge.

15. A method, comprising:
transferring a first set of dies from an array of N*M die transfer seats to an array of M bonding heads, wherein each of N and M is a whole number greater than 1 M is a number of bonding heads, and N is (a number of die transfer seats/the number of bonding heads);
bonding the first set of dies to a destination substrate;
transferring a second set of dies from the array of N*M die transfer seats to the array of M bonding heads; and
bonding the second set of dies to the destination substrate.

16. The method of claim 15, further comprising loading die transfer seats within the array of N*M die transfer seats with the first set of dies and the second set of dies, wherein loading the first set of dies and the second set of dies is performed before transferring the first set of dies to the array of M bonding heads and before transferring the second set of dies to the array of M bonding heads.

17. The method of claim 16, wherein loading the die transfer seats within the array of N*M die transfer seats comprises picking up the first set of dies, the second set of dies, or both the first set of dies and the second set of dies using an array of N*M pick-up heads.

18. The method of claim 16, wherein loading the die transfer seats is performed using a die loading machine.

19. The method of claim 15, wherein:
the array of M bonding heads has a bonding head pitch,
positioning the array of N*M die transfer seats to a first position before transferring the first set of dies, and
positioning the array of N*M transfer seats to a second position before transferring the second set of dies, wherein a distance between the first position and the second position is within 2.0% of 0.5 times the bonding head pitch.

20. The method of claim 15, wherein bonding the first set of dies, bonding the second set of dies, or bonding the first set of dies and bonding the second set of dies is part of a hybrid bonding operation.

\* \* \* \* \*